United States Patent
Adachi et al.

(10) Patent No.: US 10,964,826 B2
(45) Date of Patent: Mar. 30, 2021

(54) SOLAR CELL AND PRODUCTION METHOD THEREFOR, AND SOLAR CELL MODULE

(71) Applicant: KANEKA CORPORATION, Osaka (JP)

(72) Inventors: Daisuke Adachi, Settsu (JP); Kunta Yoshikawa, Settsu (JP)

(73) Assignee: KANEKA CORPORATION, Osaka (JP)

( * ) Notice: Subject to any disclaimer, the term of this patent is extended or adjusted under 35 U.S.C. 154(b) by 479 days.

(21) Appl. No.: 15/033,230

(22) PCT Filed: Oct. 29, 2014

(86) PCT No.: PCT/JP2014/078749
§ 371 (c)(1),
(2) Date: Jun. 24, 2016

(87) PCT Pub. No.: WO2015/064634
PCT Pub. Date: May 7, 2015

(65) Prior Publication Data
US 2016/0308079 A1    Oct. 20, 2016

(30) Foreign Application Priority Data
Oct. 30, 2013 (JP) .............................. JP2013-225276

(51) Int. Cl.
*H01L 31/18* (2006.01)
*H01L 31/0224* (2006.01)
(Continued)

(52) U.S. Cl.
CPC ................ *H01L 31/022425* (2013.01); *H01L 31/02167* (2013.01); *H01L 31/022466* (2013.01);
(Continued)

(58) Field of Classification Search
CPC ............. H01L 31/022425; H01L 31/07; H01L 31/0224; H01L 31/048–0488
(Continued)

(56) References Cited

U.S. PATENT DOCUMENTS 4,869,755 A * 9/1989 Huschka ........... H01L 31/02167
136/259
5,707,459 A * 1/1998 Itoyama ................. H01L 31/048
136/251
(Continued)

FOREIGN PATENT DOCUMENTS

JP    H09129904 A    5/1997
JP    2001044461 A    2/2001
(Continued)

OTHER PUBLICATIONS

Liu, C. et al., "ITO as a Diffusion Barrier Between Si and Cu," Journal of the Electrochemical Society, vol. 152, No. 3, Mar. 2005, Available Online Feb. 1, 2005, 6 pages.
(Continued)

*Primary Examiner* — Niki Bakhtiari
(74) *Attorney, Agent, or Firm* — Alleman Hall Creasman & Tuttle LLP

(57) ABSTRACT

A photoelectric conversion section of a solar cell has a first electrode layer and a collecting electrode that are formed in this order on a first principal surface, and has a second electrode layer that is formed on a second principal surface. The collecting electrode includes a first electroconductive layer, an insulating layer, and a second electroconductive layer in this order on the first electrode layer. The first and second electroconductive layers are electrically connected via an opening section in the insulating layer. At peripheral edge of the first and second principal surfaces, the photoelectric conversion section has an insulating region excluding the first or second electrode layer. On the side of the
(Continued)

principal surface having no insulating region, the first or second electrode layer is formed up to the peripheral end of the relevant principal surface.

7 Claims, 8 Drawing Sheets

(51) Int. Cl.
    *H01L 31/0747* (2012.01)
    *H01L 31/0216* (2014.01)
    *H01L 31/046* (2014.01)
(52) U.S. Cl.
    CPC ........ *H01L 31/046* (2014.12); *H01L 31/0747* (2013.01); *H01L 31/1884* (2013.01); *Y02E 10/50* (2013.01)
(58) Field of Classification Search
    USPC .................................................. 136/243–265
    See application file for complete search history.

(56) References Cited

U.S. PATENT DOCUMENTS

| 5,935,344 | A | * | 8/1999 | Endo | ..................... | H01L 31/202 |
| | | | | | | 136/255 |
| 7,781,669 | B2 | * | 8/2010 | Terakawa | ........ | H01L 31/022466 |
| | | | | | | 136/243 |
| 2006/0219292 | A1 | | 10/2006 | Asaumi et al. | | |
| 2009/0242032 | A1 | * | 10/2009 | Yamazaki | ....... | H01L 31/022425 |
| | | | | | | 136/261 |
| 2010/0200048 | A1 | * | 8/2010 | Taruno | ..................... | H02S 30/10 |
| | | | | | | 136/251 |
| 2012/0240998 | A1 | * | 9/2012 | Ballif | .............. | H01L 31/022425 |
| | | | | | | 136/256 |
| 2013/0312827 | A1 | * | 11/2013 | Adachi | ........... | H01L 31/022425 |
| | | | | | | 136/256 |
| 2015/0075601 | A1 | * | 3/2015 | Adachi | ........... | H01L 31/022425 |
| | | | | | | 136/256 |

FOREIGN PATENT DOCUMENTS

| JP | 2006310774 A | 11/2006 |
| WO | 2011045287 A1 | 4/2011 |
| WO | 20110425287 A1 | 4/2011 |
| WO | 2013077038 A1 | 5/2013 |
| WO | 2014192739 A1 | 12/2014 |

OTHER PUBLICATIONS

ISA Japanese Patent Office, International Search Report Issued in Application No. PCT/JP2014/078749, dated Feb. 10, 2015, WIPO, 3 pages.

International Bureau of WIPO, International Preliminary Report on Patentability Issued in Application No. PCT/JP2014/078749, dated May 12, 2016, WIPO, 8 pages.

* cited by examiner before annealing
(after printing)         after annealing before sintering after sintering onset
(initial sintering stage)

grain boundary after sintering onset

SOLAR CELL AND PRODUCTION METHOD THEREFOR, AND SOLAR CELL MODULE

TECHNICAL FIELD

The present invention relates to a solar cell and a method for production therefor. Further, the present invention relates to a solar cell module.

BACKGROUND ART

In a solar cell, carriers (electrons and holes) generated by light irradiation to a photoelectric conversion section including a semiconductor junction or the like are extracted to an external circuit to generate electricity. A collecting electrode is provided on the photoelectric conversion section of the solar cell for efficiently collecting carriers generated at the photoelectric conversion section to the external circuit. For example, in a crystalline silicon-based solar cell using a single-crystalline silicon substrate or a polycrystalline silicon substrate, a collecting electrode made of a fine metal is provided on a light receiving surface. In a heterojunction solar cell having amorphous silicon layers and transparent electrode layers on a crystalline silicon substrate, a collecting electrode is provided on the transparent electrode layer.

The collecting electrode of the solar cell is generally formed by pattern-printing a silver paste by a screen printing method. However, the collecting electrode formed by using a silver paste has high resistivity, and material cost of the silver paste is expensive. A method is known in which a collecting electrode is formed by a plating method, which is excellent in terms of material and process costs.

When a collecting electrode is formed by a plating method, generally a resist layer having an opening is formed on a transparent electrode layer, and a metal layer of copper or the like is formed at the opening of the resist on the transparent electrode layer by electroplating. However, a resist material is expensive, and a mask is needed for formation of a resist having a specified opening. Therefore, when a resist is used, the advantage of a plating method in terms of material cost and process cost is compromised.

Thus, there has been proposed a method for forming a collecting electrode by a plating method without using a resist. For example, Patent Document 1 and Patent Document 2 propose a method in which an electroconductive seed is formed on a transparent electrode layer by a printing method or the like, an insulating layer having an opening section is formed thereon, and a metal electrode layer is formed via the opening section of the insulating layer by electroplating. Patent Document 2 proposes a method in which an insulating layer is formed on an electroconductive seed containing a low-melting-point material, annealing is then performed by heating to thermally fluidize the low-melting-point material in the electroconductive seed thereby forming an opening section in the insulating layer.

Methods in Patent Documents 1 and 2 are advantageous in terms of material costs and process costs because a fine line patterned collecting electrode can be formed by a plating method without using a resist. By providing a low-resistance metal seed, the contact resistance between a transparent electrode layer and a collecting electrode can be lowered.

In formation of a photoelectric conversion section of a solar cell, thin-films such as a semiconductor layer, a transparent electrode layer and a metal electrode layer are generally formed on the surface of a substrate by a plasma-enhanced CVD method, a sputtering method or the like. These thin-films exist not only on the front surface of a substrate, but also on the side surface and on the back surface since the deposited films wrap around thereon, and thereby cause a short circuit and leakage between the front surface and the back surface. For preventing the above-described wraparound of thin-films, for example, a method is proposed in Patent Document 3 in which a semiconductor layer and a transparent electrode layer are formed with the peripheral end of a crystalline silicon substrate covered with a mask.

Patent Documents 4 and 5 disclose methods for eliminating a short circuit portion by performing specific processing after forming a semiconductor thin-film and an electrode on a substrate. Specifically, Patent Document 4 discloses a method in which a groove is formed by laser irradiation, and thereafter a crystalline silicon substrate is cleaved along the groove to form a solar cell in which the side surface of a photoelectric conversion section is composed of a cut surface. In Patent Document 5, a method is proposed in which a semiconductor layer and a transparent electrode layer formed on a crystalline silicon substrate are removed by laser irradiation to form a separation groove. Either a semiconductor thin-film or an electrode is not present on the cut surface in Patent Document 4 and the surface of the separation groove in Patent Document 5, and therefore the problem of short circuit resulting from wraparound is solved.

In Patent Document 5, a configuration is illustrated in which a transparent electrode layer and a semiconductor layer of a conductivity type are removed by laser irradiation, but it is difficult to selectively remove only these layers by laser irradiation. Therefore, generally a groove formed by laser irradiation reaches the surface or the inside of a crystalline silicon substrate.

PRIOR ART DOCUMENTS

Patent Documents

Patent Document 1: WO 2011/045287
Patent Document 2: WO 2013/077038
Patent Document 3: JP-A 2001-44461
Patent Document 4: JP-A 2006-310774
Patent Document 5: JP-A 9-129904

Non-Patent Document

Non-Patent Document 1: C. M. Liu et. al, *Journal of The Electrochemical Society*, 152 (3), G234~G239, (2005).

SUMMARY OF THE INVENTION

Problems to be Solved by the Invention

In a method including forming a semiconductor layer and an electrode layer while covering the peripheral end of a substrate with a mask as in Patent Document 3, a mask is used during formation of a film on each of both surfaces of the substrate, and therefore the step for alignment of the mask is needed to reduce productivity. Further, since carriers at the peripheral end of the substrate cannot be collected by the electrode layer, the carrier collection efficiency tends to decrease to cause a loss (a decrease in fill factor (FF)).

When the peripheral portion of a substrate is cleaved and removed as in Patent Document 4, the current amount tends to decrease because the area of the silicon substrate becomes smaller. In a method including forming a separation groove as in Patent Document 5, the outer circumference of the separation groove cannot be used as an effective power generation region, and therefore the current amount tends to decrease as in the case of the method in Patent Document 4.

Further, in the configuration in which a short-circuit and leakage between the surface and the back surface are prevented by the method as in Patent Documents 3 to 5, power generation efficiency tends to be deteriorated when a collecting electrode is formed by the plating method as in Patent Documents 1 and 2. For example, in the method using a mask as in Patent Document 3 and the method including forming a separation groove as in Patent Document 4, a semiconductor layer and a transparent electrode layer on a silicon substrate are removed, and the silicon substrate is exposed at regions where these layers are removed. In the method including cleaving a substrate as in Patent Document 5, the side surface (cut surface) of a silicon substrate is exposed. Indium tin oxide (ITO) etc. to be used as a material of a transparent electrode layer is known to act as a diffusion block layer which prevents diffusion of copper to a silicon substrate (e.g., Non-Patent Document 1). When a collecting electrode is formed by a plating method in the case where there exists a portion in which a silicon substrate is exposed, such as a separation groove or a cut surface, metal components etc. in a plating solution are diffused into the silicon substrate from the exposed portion of the silicon substrate to adversely affect electrical characteristics, and this may cause deterioration of power generation efficiency.

Thus, when a short-circuit and leakage between both surfaces of a substrate are to be prevented by deposition with using a mask, formation of a separation groove by a laser, or a method including cleaving a substrate, or the like, there is the problem that the effective area decreases and that metal components etc. are diffused from the exposed portion of a silicon substrate, and an effective solution has not been found yet.

An object of the present invention is to form a collecting electrode by a plating method capable of reducing material costs and process costs of a solar cell, and improve conversion efficiency of the solar cell by solving the problems described above.

Means for Solving the Problems

The inventors have extensively conducted studies and resultantly found that the above-mentioned problems are solved by forming an electrode layer up to the peripheral end on one principal surface of a substrate, and providing an insulating region rather than forming an electrode layer at the peripheral end on the other principal surface.

The present invention relates to a solar cell including a photoelectric conversion section; a first electrode layer and a collecting electrode sequentially formed on a first principal surface of the photoelectric conversion section; and a second electrode layer formed on a second principal surface of the photoelectric conversion section. A transparent electrode layer is used as the first electrode layer. A transparent electrode layer, a metal electrode layer, or a multilayer structure in which these layers are stacked may be employed as the second electrode layer.

In the solar cell according to the present invention, the collecting electrode includes a first electroconductive layer, an insulating layer and a second electroconductive layer in this order from the photoelectric conversion section side. The insulating layer is provided with an opening section, and the first electroconductive layer and the second electroconductive layer are in conduction with each other via the opening section of the insulating layer.

The solar cell according to the present invention has an "insulating region" where neither of the first electrode layer and the second electrode layer are formed. The insulating region is provided at the peripheral edge of any one of the first principal surface and the second principal surface of the photoelectric conversion section. Among any of the first electrode layer on the first principal surface and the second electrode layer on the second principal surface, the electrode layer that is provided on a principal surface having insulating region is not formed at the peripheral end of the relevant principal surface, and the electrode layer that is provided on a principal surface having no insulating region is formed up to the peripheral end of the relevant principal surface.

On the first principal surface of the photoelectric conversion section, the insulating layer is formed also on a first electroconductive layer-non-formed region. More preferably, the insulating layer is formed up to the peripheral end of the first principal surface. Preferably, the insulating layer is formed also on the side surface of the photoelectric conversion section.

In a preferred embodiment of the present invention, at least a part of the insulating region is covered with the insulating layer. Particularly, it is preferable that the insulating region on the first principal surface of the photoelectric conversion section is covered with the insulating layer. For example, when the insulating region exists on the first principal surface of the photoelectric conversion section, the insulating region is covered with the insulating layer by forming the insulating layer up to the peripheral end on the first principal surface.

In one embodiment of the present invention, the insulating region exists on the second principal surface of the photoelectric conversion section. When the second electrode layer includes the metal electrode layer, it is preferable that the insulating region is provided on the second principal surface. The insulating region on the second principal surface can be provided by forming the second electrode layer with the peripheral end of the second principal surface covered with a mask so that the second electrode layer is prevented from being formed at the peripheral end of the second principal surface and on the side surface of the photoelectric conversion section. In this embodiment, light arriving at the second principal surface of the photoelectric conversion section can be reflected at the metal electrode layer and reutilized, and light from the side surface can be made incident to the inside of the photoelectric conversion section, so that light utilization efficiency is improved, and thus improvement of conversion efficiency (particularly a current value) can be expected.

In one embodiment of the present invention, a first circumferential direction region having the insulating region on the first principal surface and a second circumferential direction region having the insulating region on the second principal surface exist at the peripheral portion of the photoelectric conversion section.

Among any of the first electrode layer on the first principal surface and the second electrode layer on the second principal surface in the solar cell according to the present invention, the electrode layer on a principal surface having no insulating region is preferably formed also on the side surface of the photoelectric conversion section at the peripheral portion. When the first circumferential direction region having the insulating region on the first principal surface and the second circumferential direction region having the insulating region on the second principal surface exist at the peripheral portion of the photoelectric conversion section, it is preferable that the second electrode layer in the first circumferential direction region is formed on the side surface, and the first electrode layer in the second circumferential direction region is formed on the side surface.

A preferred embodiment of the solar cell according to the present invention is a heterojunction solar cell in which the photoelectric conversion section has a silicon-based thin-film on a first principal surface of a crystalline silicon substrate of first conductivity-type.

The present invention also relates to a solar cell module including the solar cell.

Further, the present invention relates to a method for producing the solar cell. The production method according to the present invention includes: a first electrode layer forming step of forming a first electrode layer on a first principal surface of a photoelectric conversion section; and a second electrode layer forming step of forming a second electrode layer on a second principal surface of the photoelectric conversion section. The production method according to the present invention further includes: a first electroconductive layer forming step of forming a first electroconductive layer on the first electrode layer; an insulating layer forming step of forming an insulating layer on the first electroconductive layer; and a plating step of forming a second electroconductive layer conducting with the first electroconductive layer via an opening provided in the insulating layer by a plating method, in this order.

In the production method according to the present invention, the electrode layer is formed with the peripheral end of the principal surface of the photoelectric conversion section covered with a mask in any one of the first electrode layer forming step and the second electrode layer forming step. Since the electrode layer is formed with the peripheral edge is covered with a mask, the electrode layer is not formed at the peripheral end of the relevant principal surface. In the step of forming the other electrode layer, the electrode layer is formed without covering the peripheral end of the photoelectric conversion section with a mask, and therefore the electrode layer is formed up to the peripheral end of the relevant principal surface.

Effects of the Invention

According to the present invention, a collecting electrode is formed by a plating method, and therefore the resistance of the collecting electrode is reduced, so that the conversion efficiency of a solar cell can be improved. Since an insulating region exists on a first principal surface or a second principal surface of a photoelectric conversion section, deterioration of conversion characteristics by a short-circuit is suppressed. According to the configuration of the present invention, an effective area that contributes to photoelectric conversion can be enlarged, and therefore conversion efficiency can be improved. In the process for production of a solar cell according to the present invention, a mask may be used in only one of formation of a first electrode layer and formation of a second electrode layer, and therefore the step for alignment of the mask is reduced to improve productivity.

DESCRIPTION OF EMBODIMENTS

Figure 1:
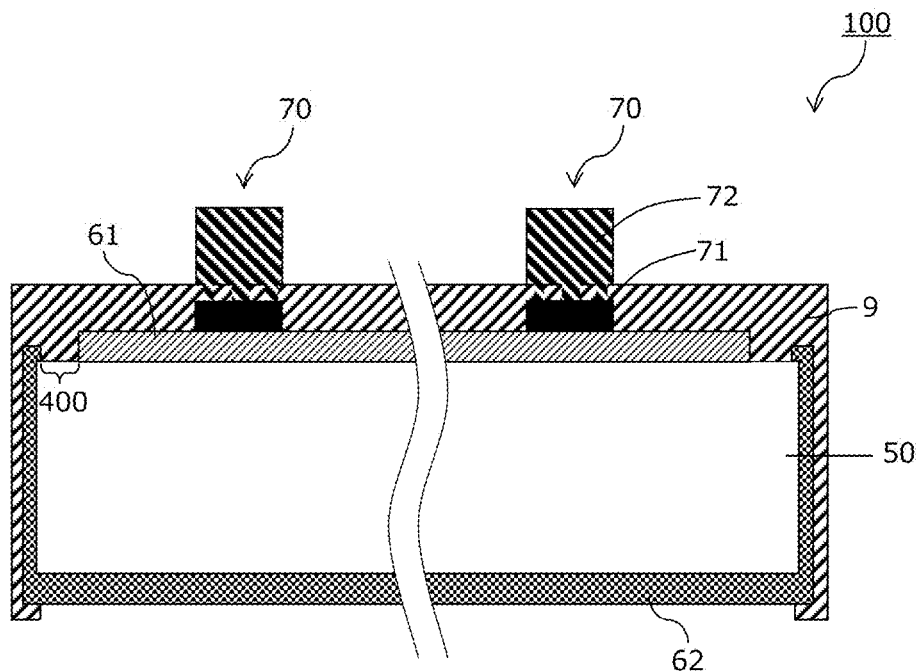
FIG. 1 is a schematic sectional view showing one embodiment of a solar cell of the present invention.

As schematically shown in FIG. 1, the solar cell 100 of the present invention includes a photoelectric conversion section 50. The photoelectric conversion section 50 includes a semiconductor junction, for example. A first electrode layer 61 and collecting electrode 70 are provided on a first principal surface of the photoelectric conversion section 50, and a second electrode layer 62 is provided on a second principal surface of the photoelectric conversion section 50.

The collecting electrode 70 includes a first electroconductive layer 71, an insulating layer 9 and a second electroconductive layer 72 in this order from the photoelectric conversion section 50 side. The insulating layer 9 covers the first electroconductive layer 71, and is formed also on a first electroconductive layer-non-formed region. The insulating layer 9 on the first electroconductive layer-formed region is provided with an opening section, and the first electroconductive layer 71 and the second electroconductive layer 72 are in conduction with each other via the opening section of the insulating layer 9.

The solar cell according to the present invention has an insulating region 400 where neither of the first electrode layer 61 and the second electrode layer 62 are formed. The insulating region 400 is provided at the peripheral edge of any one of the first principal surface and the second principal surface of the photoelectric conversion section 50. On a principal surface having the insulating region 400, the electrode layer is not formed at the peripheral end of the relevant principal surface. On the other principal surface having no insulating region, the electrode layer is formed up to the peripheral end of the relevant principal surface.

For example, in the embodiment shown in FIG. 1, the insulating region 400 exists on the first principal surface of the photoelectric conversion section 50 because the electrode layer 61 on the first principal surface is not formed at the peripheral end of the first principal surface. On the other hand, the electrode layer 62 on the second principal surface is formed up to the peripheral end of the principal surface. Conversely, when the second electrode layer on the second principal surface is not formed at the peripheral end of the second principal surface, the insulating region exists on the second principal surface of the photoelectric conversion section, and the first electrode layer is formed up to the peripheral end of the photoelectric conversion section (see FIGS. 5A to 5D). In FIGS. 6A to 6D, a portion having the insulating region on the first principal surface (first circumferential direction region) and a portion having the insulating region on the second principal surface (second circumferential direction region) exist at the peripheral portion of the photoelectric conversion section. In the first circumferential direction region, the first electrode layer is not formed at the peripheral end of the first principal surface and the second electrode layer is formed up to the peripheral end of the second principal surface. In the second circumferential direction region, the second electrode layer is not formed at the peripheral end of the second principal surface and the first electrode layer is formed up to the peripheral end of the first principal surface.

In this specification, the "peripheral end" refers to the end edge of the principal surface. The "peripheral edge" refers to the peripheral end and a region extending over a certain distance (e.g., approximately several tens m to several mm) from the peripheral end. The "peripheral portion" refers to a region including side surface and the peripheral edges of the first principal surface and the second principal surface.

The present invention will be described more in detail below taking as an example a heterojunction crystalline silicon solar cell (hereinafter, referred to as a "heterojunction solar cell" in some cases) as one embodiment of the present invention. The heterojunction solar cell is a crystalline silicon-based solar cell in which a silicon-based thin-film having a band gap different from that of a single-crystalline silicon is formed on a surface of a crystalline silicon substrate of a first conductivity type to produce a diffusion potential. The silicon-based thin-film is preferably amorphous. Above all, a heterojunction solar cell having a thin intrinsic amorphous silicon layer interposed between a conductive amorphous silicon-based thin-film for forming a diffusion potential and a crystalline silicon substrate is known as one configuration of crystalline silicon solar cell with highest conversion efficiency.

Figure 2:
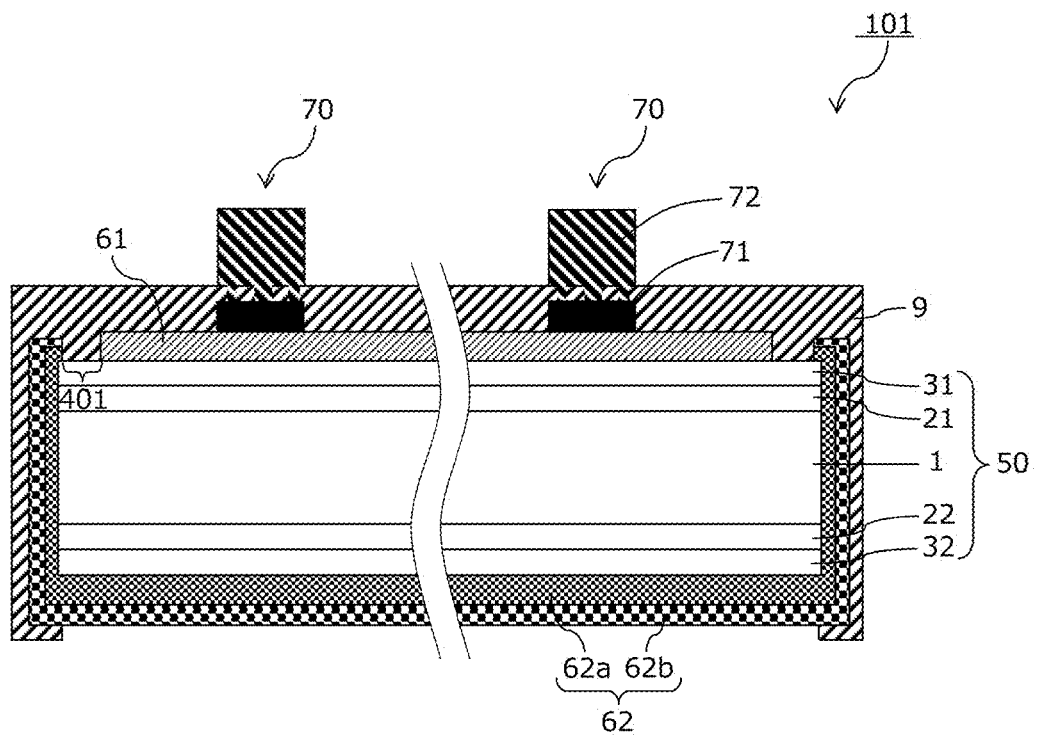
FIG. 2 is a schematic sectional view showing a heterojunction solar cell according to one embodiment.

FIG. 2 is a schematic sectional view of a hetero-unction solar cell according to one embodiment of the present invention. The heterojunction solar cell 101 shown in FIG. 2 includes an insulating region 401 on the first principal surface.

A photoelectric conversion section 50 in the crystalline silicon-based solar cell 101 includes conductive silicon-based thin-films 31 and 32, respectively on one surface (first principal surface; light-incident surface) and the other surface (second principal surface; back surface) of a single-crystalline silicon substrate of a first conductivity type. Intrinsic silicon-based thin-films 21 and 22 are preferably provided between the single-crystalline silicon substrate 1 of the first conductivity type and the conductive silicon-based thin-films 31 and 32.

Generally, the single-crystalline silicon substrate contains impurities that supply charges to silicon for imparting conductivity. A single-crystalline silicon substrate of a first conductivity type is classified into an n-type which contains atoms for introducing electrons into silicon atoms (e.g., phosphorus) and a p-type which contains atoms for introducing holes into silicon atoms (e.g., boron). The "first conductivity type" in this specification means one of the n-type and the p-type. In a hetero-junction solar cell, it is preferable to use an n-type single-crystalline silicon substrate as the single-crystalline silicon substrate of a first conductivity type 1 and the conductive silicon-based thin-film 31 on the light incident side is p-type to efficiently separate and collect electron/hole pairs. In order to enhance a light confinement, the single-crystalline silicon substrate 1 preferably has textured structure (not shown in the drawings) in its surface.

Silicon based thin-films are deposited on the crystalline silicon substrate 1. The intrinsic silicon-based thin-films 21 and 22 are preferably i-type hydrogenated amorphous silicon composed of silicon and hydrogen. When i-type hydrogenated amorphous silicon is deposited on a single-crystalline silicon substrate, surface passivation can be effectively performed while suppressing diffusion of impurities to the single-crystalline silicon substrate.

The conductive silicon-based thin-films 31 and 32 are silicon-based thin-film of the first conductivity type or an opposite conductivity type. For example, when an n-type single-crystalline silicon substrate is used as the single-crystalline silicon substrate 1 of the first conductivity type, the silicon-based thin-film of the first conductivity type and the silicon-based thin-film of the opposite conductivity type are n- and p-types, respectively. Examples of the silicon-based thin-film include amorphous silicon-based thin-films and microcrystalline silicon-based thin-films (thin-films containing amorphous silicon and crystalline silicon). For the silicon-based thin-film, not only silicon but also a silicon-based alloy such as silicon oxide, silicon carbide or silicon nitride can be used. The silicon-based thin-film is preferably an amorphous silicon thin-film.

On the first principal surface of the photoelectric conversion section 50 (on the conductive silicon-based thin-film 31), a transparent electrode layer having a conductive oxide as a main component is formed as a first electrode layer 61. As the conductive oxide, for example, zinc oxide, indium oxide and tin oxide may be used alone or in mixture thereof. From the viewpoints of electroconductivity, optical characteristics and long-term reliability, indium-based oxides are preferable. Among them, those having indium tin oxide (ITO) as a main component are more suitably used. Here, the wording "as a main component" means that the content is more than 50% by weight, preferably 70% by weight or more, more preferably 90% by weight or more. The transparent electrode layer may be a single layer or a layered structure composed of multiple layers.

The thickness of the first electrode layer 61 is preferably set to 10 nm or more and 140 nm or less, from the viewpoints of transparency, electroconductivity and reduction of light reflection. The role of the first electrode layer is to transport carriers to the collecting electrode 70, and it suffices that the first electrode layer has a level of electroconductivity required for this purpose.

A second electrode layer 62 is formed on the second principal surface of the photoelectric conversion section 50 (on the conductive silicon-based thin-film 32). A transparent electrode layer, a metal electrode layer and the like can be used for the second electrode layer 62. As shown in FIG. 2, the second electrode layer 62 may be a stack of a transparent electrode layer 62a and a metal electrode layer 62b. As the metal electrode layer, it is desirable to use a material having a high reflectivity in a near-infrared to infrared range, and having high electroconductivity and chemical stability.

Examples of the material satisfying these characteristics include silver, copper and aluminum.

When the second electrode layer 62 includes a metal electrode layer, light which is not absorbed in the photoelectric conversion section and arrives at the second principal surface is reflected by the metal electrode layer, and made incident to the photoelectric conversion section again, and thus light utilization efficiency can be improved. Particularly, silicon has a small absorption coefficient at a near-infrared or longer wavelength, and therefore by using, as the metal electrode layer, a material having a high reflectance to light in the near-infrared to infrared region, light utilization efficiency can be improved to increase the photocurrent of the solar cell. When the transparent electrode layer 62a mainly composed of a metal oxide exists between the photoelectric conversion section 50 and the metal electrode layer 62b, adhesion between the photoelectric conversion section and the second electrode layer is improved and contact resistance is reduced, and also diffusion of metal components to the photoelectric conversion section from the metal electrode layer 62 is suppressed by the transparent electrode layer 62a, so that conversion characteristics can be improved.

On the first electrode layer 61, a collecting electrode 70 including a first electroconductive layer 71 and a second electroconductive layer 72. An insulating layer 9 is formed between the first electroconductive layer 71 and the second electroconductive layer 72. The insulating layer 9 is formed also on a first electroconductive layer-non-formed region on the first principal surface. In the embodiment shown in FIG. 2, an insulating region 401 on the first principal surface of the photoelectric conversion section 50 is covered with the insulating layer 9.

As the method for forming the silicon-based thin-film, the transparent electrode layer and the metal electrode layer, a dry process such as a CVD method, a sputtering method or a vapor deposition method is preferred. In particular, the silicon-based thin-film is formed preferably by a plasma-enhanced CVD method. The method for forming the transparent electrode layer is preferably a physical vapor deposition method such as a sputtering method, a chemical vapor deposition (MOCVD) method using a reaction of an organic metal compound with oxygen or water, or the like. The method for forming the metal electrode layer is preferably a physical vapor deposition method such as a sputtering method or a vacuum vapor deposition method. The metal electrode layer can also be formed by a printing method such as screen printing.

[Configuration of Peripheral Portion]

Figure 3:
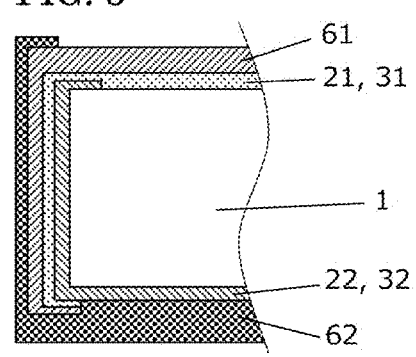
FIG. 3 is a schematic sectional view schematically showing a state in which silicon-based thin-films and electrode layers are formed without using a mask in a manufacturing process of a solar cell.

FIG. 3 is a sectional view schematically showing a state in which silicon-based thin-films 21 and 31 and a first electrode layer 61 are formed on a first principal surface of a silicon substrate 1, and silicon-based thin-films 22 and 32 and a second electrode layer 62 are formed on a second principal surface of a silicon substrate 1, without using a mask. FIG. 3 schematically shows a structure when an intrinsic silicon-based thin-film 22 and a conductive silicon-based thin-film 32 are formed on the second principal surface of the silicon substrate 1, an intrinsic silicon-based thin-film 21 and a conductive silicon-based thin-film 31 are thereafter formed on the first principal surface, and thereafter a first electrode layer 61 and a second electrode layer 62 are formed (the order of formation of the layers of the crystalline silicon-based solar cell is not limited to the configuration shown in FIG. 3).

When the layers are formed by a dry process such as CVD method and sputtering method without using a mask, the silicon-based thin-films 22 and 32 and the second electrode layer 62 on the second principal surface of the silicon substrate 1 extend to the side surface and peripheral end of the first principal surface of the crystalline silicon substrate 1 due to wraparound during deposition. The silicon-based thin-films 21 and 31 and the first electrode layer 61, which are formed on the first principal surface of the crystalline silicon substrate 1, extend to the side surface and the peripheral end of second principal surface of the single-crystalline silicon substrate 1 of the first conductivity-type due to wraparound during deposition. When such wraparound occurs during the deposition, the characteristics of the solar cell may be deteriorated as the first electrode layer 61 and the second electrode layer 62 are short circuited as is understood from FIG. 3.

In the solar cell according to the present invention, an insulating region on which neither of the first electrode layer and the second electrode layer are provided exists at the peripheral edge of any one of the first principal surface and the second principal surface of the photoelectric conversion section. By forming the insulating region, the problem of short-circuit due to wraparound during deposition can be solved. For example, in the embodiment shown in FIG. 2, the electrode layer on the first principal surface is not formed at the peripheral end of the first principal surface, and therefore even when the second electrode layer on the second principal surface wraps around to the peripheral end of the first principal surface, the insulating region 401 exists on the first principal surface.

Figure 4A:
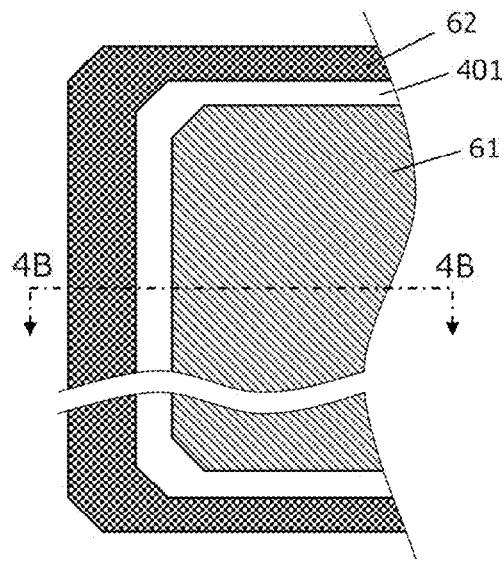
FIG. 4A is a plane view of a solar cell of one embodiment viewed from first principal surface side.
Figure 4B:
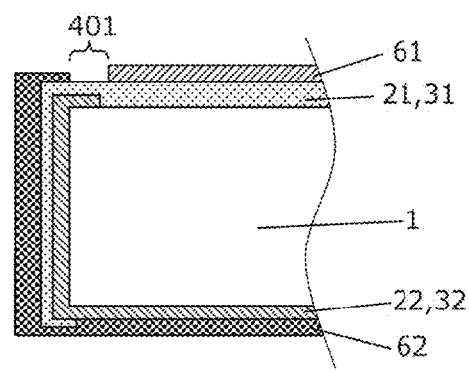
FIGS. 4B and 4C are schematic sectional views showing a process of manufacturing a solar cell in one embodiment.
Figure 4B:
Figure 4C:
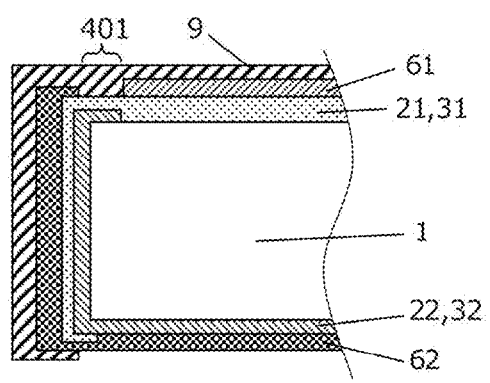

FIGS. 4A to 4C are views schematically showing a peripheral portion in the process for production of a crystalline silicon-based solar cell having the insulating region 401 on the first principal surface. FIG. 4A is a plan view from the first principal surface side. FIG. 4A shows a state in which the silicon-based thin-films 21 and 31 and the first electrode layer 61 are formed on the first principal surface of the crystalline silicon substrate 1 and the silicon-based thin-films 22 and 32 and the second electrode layer 62 are formed on the second principal surface of the crystalline silicon substrate 1. FIG. 4B is a sectional view taken along line 4B-4B in FIG. 4A.

As shown in FIG. 4B, the second electrode layer 62 is formed up to the peripheral end of the second principal surface of the photoelectric conversion section and wraps around to the side surface and the peripheral end of the first principal surface of the photoelectric conversion section. On the other hand, the first electrode layer 61 is not formed at the peripheral end of the first principal surface, and thus the insulating region 401 exists at the peripheral edge of the first principal surface. For example, by covering the peripheral end of the first principal surface of the photoelectric conversion section with a mask during formation of the first electrode layer 61, the first electrode layer 61 is prevented from being formed at the peripheral end of the first principal surface, so that the insulating region can be formed at the peripheral edge of the first principal surface. The first electrode layer 61 at the peripheral end portion may be chemically or physically removed by etching or the like after the first electrode layer 61 is formed on the whole first principal surface. The method for providing an insulating region at the peripheral edge of the first principal surface is preferably a method in which the first electrode layer is formed with the peripheral end of the first principal surface covered with a mask from the viewpoint of productivity and the viewpoint of reliably preventing a short-circuit due to wraparound during formation of the electrode layer.

Thus, existence of the insulating region on the principal surface of the photoelectric conversion section prevents a short-circuit between the first electrode layer 61 and the second electrode layer 62, so that the conversion efficiency of the solar cell is improved. When the insulating region exists on only one of the first principal surface and the second principal surface, the number of alignments of the mask can be reduced by half as compared to the case where the insulating region is formed on both the surfaces of the photoelectric conversion section, so that productivity is improved. On the second principal surface having no insulating region 401, the second electrode layer is formed at the peripheral end, and therefore carrier collection efficiency at the peripheral portion of the photoelectric conversion section is improved. Thus, according to the present invention, productivity is improved, and improvement of conversion efficiency can be expected as compared to the case where the insulating region exists on both the surfaces of the photoelectric conversion section.

In the method including cleaving a substrate, the area of the substrate decreases to reduce the power generation area. In the present invention, on the other hand, a decrease in effective power generation area can be minimized by aligning the mask during formation of the electrode layer. Further, in the configuration of the present invention, the silicon-based thin-film is formed also on the side surface of the silicon substrate, and therefore a passivation effect is obtained at the side surface of the substrate, so that improvement of the open circuit voltage (Voc) and the fill factor (FF) due to suppression of carrier recombination at the side surface is expected.

Figure 5A:
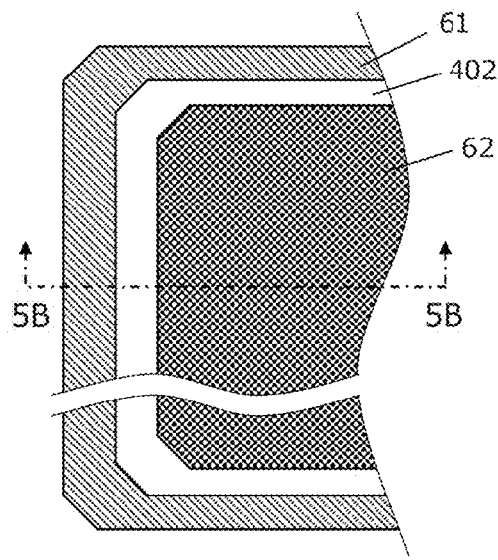
FIG. 5A is a plane view of a solar cell of one embodiment viewed from second principal surface side.
Figure 5B:
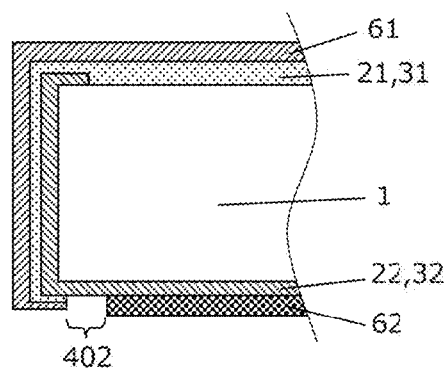
FIGS. 5B to 5D are schematic sectional views showing a process of manufacturing one embodiment of a solar cell.
Figure 5B:
Figure 5C:
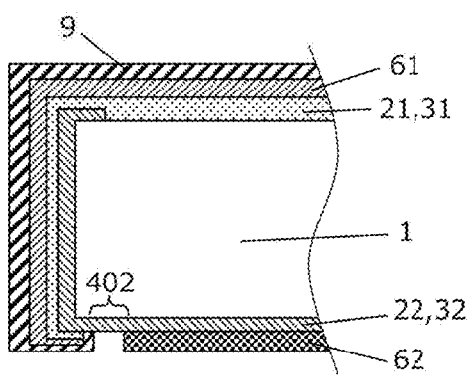

FIGS. 5A to 5D are views schematically showing a peripheral portion in the process for production of a crystalline silicon-based solar cell having an insulating region 402 on the second principal surface. FIG. 5A is a plan view from the second principal surface side. FIG. 5A shows a state in which the silicon-based thin-film and the electrode layer are formed on each of the first principal surface and the second principal surface of the crystalline silicon substrate 1. FIG. 5B is a sectional view taken along line 5B-5B in FIG. 5A. As shown in FIG. 5B, the first electrode layer 61 is formed up to the peripheral end of the photoelectric conversion section, and extends and wraps around to the side surface and the peripheral edge of the second principal surface of the photoelectric conversion section. On the other hand, the second electrode layer 62 is not formed at the peripheral end of the second principal surface, and thus the insulating region 402 exists on the second principal surface.

Also for the embodiment in which the insulating region 402 exists on the second principal surface of the photoelectric conversion section as shown in FIGS. 5A to 5D, productivity is improved, and improvement of conversion efficiency can be expected as in the case of the embodiment in which the insulating region exists on the first principal surface as described above.

In the present invention, the second electroconductive layer 72 of the collecting electrode 70 is formed by a plating method as described in detail later. In the plating, metal components etc. in a plating solution may be diffused into the silicon substrate to adversely affect the electrical characteristics of the solar cell since no electrode layer is provided on the insulating region. In the present invention, on the other hand, the insulating layer 9 is formed on the first principal surface before formation of the second electroconductive layer 72, and therefore when the insulating region 401 exists on the first principal surface, the insulating layer 9 can be made to cover the insulating region, and acts as a diffusion blocking layer for a metal etc. in a plating solution. Accordingly, in the preferred embodiment of the solar cell according to the present invention, the insulating region 401 exists on the first principal surface, and the insulating region 401 is covered with the insulating layer 9 (see FIG. 4C). Also for the embodiment in which the insulating region 402 exists on the second principal surface of the photoelectric conversion section, it is preferable that the insulating region is covered with the insulating layer 9 (see FIGS. 5C and 5D).

On the other hand, when the second electrode layer 62 includes a metal electrode layer, light from the side surface can be effectively utilized when the insulating region 402 exists on the second principal surface. When the second electrode layer is formed with the peripheral edge of the second principal surface of the photoelectric conversion section 50 covered with a mask, the second electrode layer is not formed at the peripheral end of the second principal surface of the photoelectric conversion section and on the side surface of the photoelectric conversion section, and the insulating region 402 is formed at the peripheral edge of the second principal surface (see FIG. 5B). In this embodiment, a metal electrode layer is not formed on the side surface of the photoelectric conversion section, and therefore light from the side surface of the photoelectric conversion section 50 can be made incident to the inside of the photoelectric conversion section, and utilized for photoelectric conversion (generation of carriers). Thus, in the embodiment in which the second electrode layer 62 includes a metal electrode layer, and the insulating region 402 exists on the second principal surface of the photoelectric conversion section, light arriving at the second electrode layer can be reflected by the metal electrode layer to be reutilized. In addition, light from the side surface can be effectively utilized, so that light utilization efficiency is improved. Therefore, the conversion characteristics (particularly current value) of the solar cell can be improved.

The solar cell according to the present invention is not limited to an embodiment in which the insulating region exists on only any one of the first principal surface and the second principal surface as shown in FIGS. 4A to 4C and 5A to 5D, and an embodiment shown in FIGS. 6A to 6D, for example, may be included in the present invention. In FIGS. 6A to 6D, a region having the insulating region 401 on the first principal surface (first circumferential direction region) 411 and a region having the insulating region 402 on the second principal surface (second circumferential direction region) 412 exist at the peripheral portion.

Figure 6A:
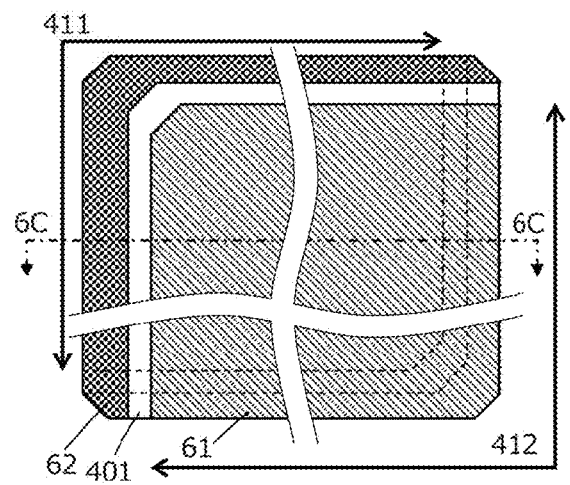
FIGS. 6A and 6B are plan views when viewed from the first principal surface and the second principal surface, respectively.
Figure 6B:
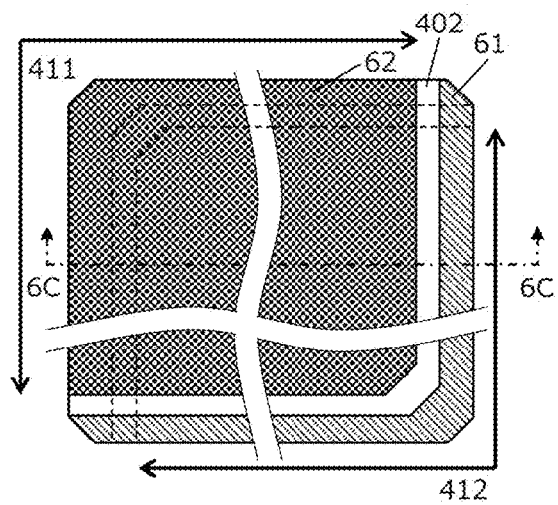
Figure 6C:
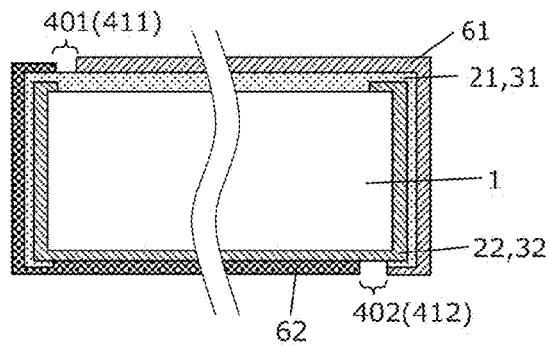
FIGS. 6C and 6D are schematic sectional views showing a process of manufacturing one embodiment of a solar cell.
Figure 6D:
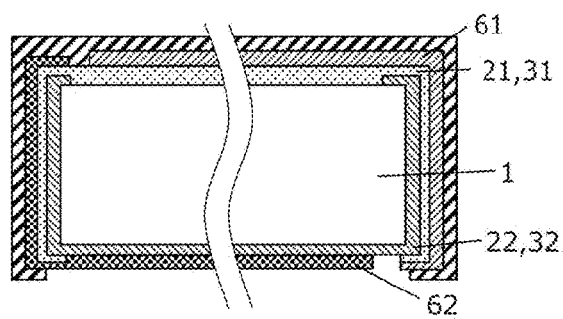

FIGS. 6A to 6D are views schematically showing a peripheral portion in the process for production of a crystalline silicon-based solar cell which has the first circumferential direction region 411 having the insulating region 401 at the peripheral edge of the first principal surface and the second circumferential direction region 412 having the insulating region 402 at the peripheral edge of the second principal surface. FIGS. 6A and 6B are plan views when viewing from the first principal surface and the second principal surface, respectively, a state in which the silicon-based thin-film and the electrode layer are formed on each of the first principal surface and the second principal surface of the crystalline silicon substrate 1. FIG. 6C is a sectional view taken along line 6C-6C in FIGS. 6A and 6B.

In the first circumferential direction region 411, the second electrode layer 62 is formed up to the peripheral end of the photoelectric conversion section, and extends and wraps around to the side surface and the peripheral end of the first principal surface of the photoelectric conversion section as shown in FIG. 6C. On the other hand, the first electrode layer 61 is not formed at the peripheral end of the first principal surface, and therefore in the first circumferential direction region 411, the insulating region 401 is formed at the peripheral edge of the first principal surface. In other words, in the first circumferential direction region 411, the first electrode layer 61 is not formed at the peripheral end of the first principal surface (see FIG. 6A), the second electrode layer 62 is formed up to the peripheral end of the second principal surface (see FIG. 6B), and the insulating region 401 exists on the first principal surface. In the second circumferential direction region 412, the first electrode layer 61 is formed up to the peripheral end of the photoelectric conversion section, and extends and warps around to the side surface and the peripheral end of the second principal surface of the photoelectric conversion section. On the other hand, the second electrode layer 62 is not formed at the peripheral end of the second principal surface, and therefore in the second circumferential direction region 412, the insulating region 402 is formed at the peripheral edge of the second principal surface. In other words, in the second circumferential direction region 412, the second electrode layer 62 is not formed at the peripheral end of the second principal surface (see FIG. 6B), the first electrode layer 61 is formed up to the peripheral end of the first principal surface (see FIG. 6A), and the insulating region 402 exists on the second principal surface. In this embodiment, there may be an area where the insulating region exists on both the first principal surface and the second principal surface like the lower left corner portion and the upper right corner portion in FIGS. 6A and 6B, respectively.

The solar cell having the first circumferential direction region and the second circumferential direction region can be produced by, for example, forming the first electrode layer 61 with the peripheral end of the first circumferential direction region of the first principal surface covered with a mask, and forming the second electrode layer with the peripheral edge of the second circumferential direction region of the second principal surface covered with a mask. This method requires alignment of the mask in each of formation of the first electrode layer on the first principal surface and formation of the second electrode layer on the second principal surface, and therefore tends to be slightly inferior in productivity as compared to the embodiment in which the insulating region 401 exists on only the first principal surface (FIGS. 4A to 4C) and the embodiment in which the insulating region 402 exists on only the second principal surface (FIGS. 5A to 5D).

On the other hand, the embodiment in which the first circumferential direction region and the second circumferential direction region exist is advantageous in that the effective area can be enlarged. Generally, crystalline silicon substrates to be used in a solar cell are rectangular substrates having almost the same size, but there are variations in size on the order of several mm. For reliably forming an insulating region at the peripheral edge of one principal surface, the electrode layer needs to be formed while a peripheral edge extending over a certain range from the peripheral end of the substrate is covered with a mask, and therefore the size of the opening of the mask is required to be matched to the size of a substrate having the smallest size within a standard range. Accordingly, even when a substrate having a large size is used, the size of the opening of the mask is fixed, and therefore the effective area size on the principal surface having an insulating region is limited by the size of a substrate that is the smallest within a standard range, so that the effective area ratio decreases.

On the other hand, in the embodiment shown in FIGS. 6A to 6D, the mask should be aligned based on a predetermined position in the first circumferential direction region (e.g., upper left corner in FIG. 6A) and the peripheral end of the first circumferential direction region is covered with the mask in formation of the first electrode layer on the first principal surface, and the mask should be aligned based on a predetermined position in the second circumferential direction region (e.g., lower right corner in FIG. 6B in formation of the second electrode layer on the second principal surface. Therefore, when the substrate has a large size, the effective area can be accordingly enlarged, so that the power generation amount of the solar cell can be increased.

[Formation of Collecting Electrode]

A collecting electrode 70 is formed on the first electrode layer 61. The collecting electrode 70 includes a first electroconductive layer 71 and a second electroconductive layer 72. Between the first electroconductive layer 71 and the second electroconductive layer 72, the insulating layer 9 is formed to cover the first electroconductive layer. In the collecting electrode 70, a part of the second electroconductive layer 72 is conductively connected with the first electroconductive layer 71 via the opening section 9h of the insulating layer 9. Here, the phrase "a part of . . . is conductively connected with . . . via the opening section of the insulating layer" refers to a state in which conductive connection is established by filling the opening section of the insulating layer, which covers the first electroconductive layer, with the material of the second electroconductive layer. As long as the first electroconductive layer and the second electroconductive layer are conductively connected with each other, the opening section may be such that the insulating layer 9 is locally very thin with the thickness of several nanometers (a complete hole is not formed). Even when the opening section is formed in the insulating layer, and conductive connection is established between the first electroconductive layer 71 and the second electroconductive layer via an oxide covering or the like formed on the surface of the first electroconductive layer, the second electroconductive layer is considered to be conductively connected with the first electroconductive layer via the opening section of the insulating layer. For example, when the low-melting-point material of the first electroconductive layer 71 is a metallic material such as aluminum, mention is made of a state in which the material of the second electroconductive layer, which fills the inside of the opening section of the insulating layer, is conductively connected with the first electroconductive layer via an oxide covering formed on the surface of the first electroconductive layer.

The method for forming an opening section in the insulating layer 9 is not particularly limited, and a method such as laser irradiation, mechanical drilling or chemical etching may be employed. In one embodiment, a method is used in which an insulating layer 9 is formed on the first electroconductive layer 71 and thereafter a low-melting-point material in the first electroconductive layer is thermally fluidized to form an opening section in the insulating layer formed thereon.

Examples of the method for forming an opening section by thermal fluidization of a low-melting-point material in the first electroconductive layer include a method in which the insulating layer 9 is formed on the first electroconductive layer 71 containing a low-melting-point material, and heating (annealing) is carried out to a temperature equal to or higher than a thermal-fluidization onset temperature $T_1$ of the low-melting-point material to change the surface shape of the first electroconductive layer, so that an opening (crack) is formed in the insulating layer 9 formed on the first electroconductive layer; and a method in which when the insulating layer 9 is formed on the first electroconductive layer 71 containing a low-melting-point material, heating is carried out to a temperature equal to or higher than the temperature $T_1$ to thermally fluidize the low-melting-point material, so that an opening is formed simultaneously with formation of the insulating layer.

Figure 7:
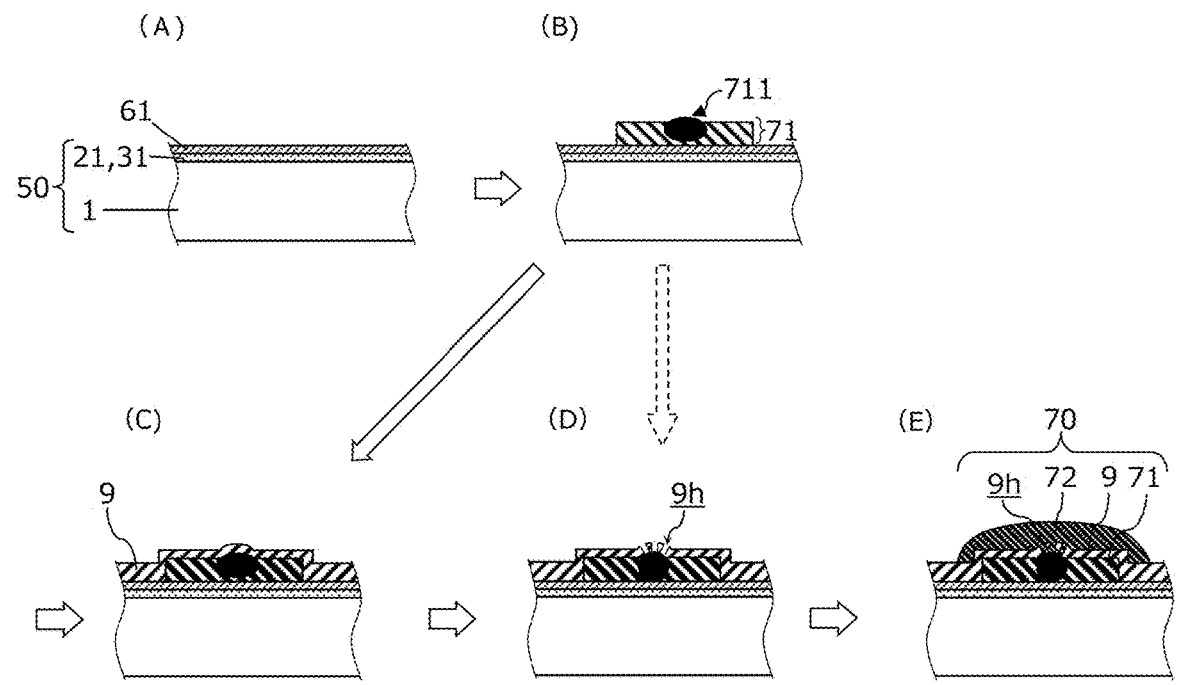
FIG. 7 is a schematic sectional view showing a formation process of a collecting electrode.

A method for forming an opening section in the insulating layer using thermal fluidization of a low-melting-point material in the first electroconductive layer will be described below with reference to the drawings. FIG. 7 is a schematic procedural view showing one embodiment of a method for forming a collecting electrode 70 on a first electrode layer 61. In the embodiment illustrated in FIG. 7, first, the photoelectric conversion section 50 with the first electrode layer 61 formed on its first principal surface is provided. The insulating region is formed at the peripheral edge of the first principal surface or the second principal surface although the peripheral portion is not illustrated in FIG. 7.

A first electroconductive layer 71 containing a low-melting-point material 711 is formed on the first electrode layer 61 (a first electroconductive layer forming step; FIG. 7 at (B)). An insulating layer 9 is formed on the first electroconductive layer 71 (insulating layer forming step; FIG. 7 at (C)). The insulating layer 9 is formed also on a region on which no first electroconductive layer 71 is formed (first electroconductive layer-non-formed region) in the photoelectric conversion section 50. When an insulating region 401 is provided on the first principal surface of the photoelectric conversion section, it is preferable that in this insulating layer forming step, the insulating layer 9 is formed also on the insulating region 401 formed in the insulating region forming step (see FIG. 7 at (C)).

After the insulating layer 9 is formed, annealing is carried out by heating (an annealing step; FIG. 7 at (D)). The first electroconductive layer 71 is heated to an annealing temperature Ta in the annealing step, so that the low-melting-point material is thermally fluidized to thereby change the surface shape, and accordingly the insulating layer 9 formed on the first electroconductive layer 71 is deformed to form an opening section 9h. The opening section 9h is formed in the form of, for example, cracks.

After carrying out the annealing, a second electroconductive layer 72 is formed by a plating method (a plating step; FIG. 7 at (E)). The first electroconductive layer 71 is covered with the insulating layer 9, but in a section, where the opening section 9h is formed in the insulating layer 9, the first electroconductive layer 71 is exposed. Therefore, the first electroconductive layer is exposed to plating solution, so that metal can be deposited at the opening section 9h as an origination point. According to this method, a second electroconductive layer matching the shape of the collecting electrode can be formed by a plating method without providing a resist material layer having an opening section matching the shape of the collecting electrode. Further, when the insulating region freed of a transparent electrode layer is covered with the insulating layer 9 in advance, impurities that may cause deterioration of solar cell characteristics (e.g., copper ions etc.) can be prevented from diffusing to the crystalline silicon substrate from the insulating region in the plating step.

The first electroconductive layer 71 is a layer that functions as an electroconductive underlying layer when the second electroconductive layer is formed by a plating method. Therefore, it suffices that the first electroconductive layer has such a level of electroconductivity that it can function as an underlying layer for electroplating. In this specification, those having a volume resistivity of $10^{-2}$ Ω·m or less are defined as being electroconductive. Those having a volume resistivity of $10^2$ Ω·m or more are defined as insulating.

The thickness of the first electroconductive layer 71 is preferably 20 µm or less, more preferably 10 µm or less, in terms of costs. On the other hand, the thickness is preferably 0.5 µm or more, more preferably 1 µm or more, so that the line resistance of the first electroconductive layer 71 falls within a desired range.

In the embodiment illustrated in FIG. 7, the first electroconductive layer 71 contains a low-melting-point material having a thermal-fluidization onset temperature $T_1$. The thermal-fluidization onset temperature is a temperature at which a material is fluidized by heating to change the surface shape of a layer containing a low-melting-point material, and is typically a melting point. As for polymer materials and glass, a material may be softened to be thermally fluidized at a temperature lower than the melting point. In these materials, the thermal-fluidization onset temperature can be defined as being equal to a softening point. The softening point is a temperature at which the viscosity is $4.5 \times 10^6$ Pa·s (same as the definition for the softening point of glass).

The low-melting-point material is preferably thermally fluidized in the annealing step, thus causing a change in surface shape of the first electroconductive layer 71. Therefore, the thermal-fluidization onset temperature $T_1$ of the low-melting-point material is preferably lower than an annealing temperature Ta. In the present invention, the annealing step is preferably carried out at the annealing temperature Ta that is lower than the heat-resistant temperature of the photoelectric conversion section 50 and the heat-resistant temperature of the first electrode layer. Therefore, the thermal-fluidization onset temperature $T_1$ of the low-melting-point material is preferably lower than the heat-resistant temperature of the photoelectric conversion section and the heat-resistant temperature of the first electrode layer.

The heat-resistant temperature of the photoelectric conversion section and the first electrode layer is a temperature at which characteristics of a solar cell module prepared using a solar cell (also referred to as a "cell") or a solar cell having the photoelectric conversion section and the first electrode layer are irreversibly reduced. For example, in the heterojunction solar cell 101 shown in FIG. 2, the single-crystalline silicon substrate 1 that forms the photoelectric conversion section 50 hardly undergoes a change in characteristics even when heated to a high temperature of 500° C. or higher, but the transparent electrode layer 61 and the silicon-based thin-films 21 and 31 may undergo thermal degradation or diffusion of dope impurities when heated to about 250° C., thus causing an irreversible reduction in the solar cell characteristics. Therefore, in the heterojunction solar cell, the first electroconductive layer 71 preferably contains a low-melting-point material having a thermal-fluidization onset temperature $T_1$ of 250° C. or lower.

The lower limit of the thermal-fluidization onset temperature $T_1$ of the low-melting-point material is not particularly limited. The low-melting-point material is preferably not thermally fluidized in the step of forming the first electroconductive layer, so that an amount of surface shape change of the first electroconductive layer in the annealing step is increased to form the opening section 9h in the insulating layer 9 easily. For example, when the first electroconductive layer is formed by coating or printing, heating may be carried out for drying. In this case, the thermal-fluidization onset temperature $T_1$ of the low-melting-point material is preferably higher than the temperature of heating for drying the first electroconductive layer. Accordingly, the thermal-fluidization onset temperature $T_1$ of the low-melting-point material is preferably 80° C. or higher, more preferably 100° C. or higher.

The low-melting-point material may be an organic substance or an inorganic substance as long as the thermal-fluidization onset temperature $T_1$ falls within the aforementioned range. The low-melting-point material may be electroconductive or insulating, but is desired to be a metallic material that has electroconductivity. If the low-melting-point material is a metallic material, the resistance value of the first electroconductive layer can be decreased, so that uniformity of the thickness of the second electroconductive layer can be improved when the second electroconductive layer is formed by electroplating. If the low-melting-point material is a metallic material, the contact resistance between the photoelectric conversion section 50 and the collecting electrode 70 can also be reduced.

As the low-melting-point material, a low-melting metallic material alone or an alloy thereof, or a mixture of various low-melting metallic materials can be suitably used. Examples of the low-melting metallic material include indium, bismuth and gallium.

Figure 9:
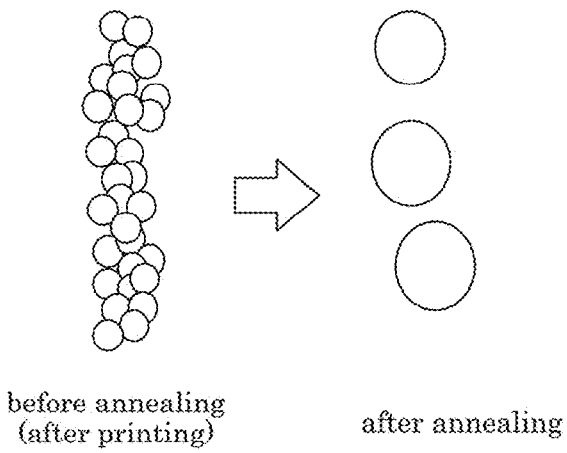
FIG. 9 is a conceptual view showing one example of a shape change of a low-melting-point material during heating.

The first electroconductive layer 71 preferably contains, in addition to the aforementioned low-melting-point material, high-melting-point material having thermal-fluidization onset temperature $T_2$ that is relatively higher than the thermal-fluidization onset temperature of the low-melting-point material. When the first electroconductive layer 71 includes a high-melting-point material, a conductive connection can be efficiently established between the first electroconductive layer and the second electroconductive layer, so that conversion efficiency of the solar cell can be improved. For example, when a material with high surface energy is used as the low-melting-point material, the first electroconductive layer 71 is exposed to a high temperature in the annealing step, the low-melting-point material is thereby brought into liquid phase state and as a result, as shown conceptually in FIG. 9, particles of the low-melting-point material aggregate into coarse particles, so that disconnecting occurs in the first electroconductive layer 71 in some cases. In contrast, the high-melting-point material is not brought into a liquid phase state by heating in the annealing step, and therefore by including the high-melting-point material in the first electroconductive layer forming material, disconnecting of the first electroconductive layer by coarsening of the low-melting-point material as shown in FIG. 9 can be suppressed.

The thermal-fluidization onset temperature $T_2$ of the high-melting-point material is preferably higher than the annealing temperature Ta. That is, when the first electroconductive layer 71 contains the low-melting-point material and the high-melting-point material, the thermal-fluidization onset temperature $T_1$ of the low-melting-point material, the thermal-fluidization onset temperature $T_2$ of the high-melting-point material and the annealing temperature Ta in the annealing step preferably satisfy $T_1<Ta<T_2$. The high-melting-point material may be an insulating material or an electroconductive material, but is preferably an electroconductive material in order to reduce the resistance of the first electroconductive layer. When the electroconductivity of the low-melting-point material is low, the overall resistance of the first electroconductive layer can be reduced by using a material having high electroconductivity as the high-melting-point material. As the electroconductive high-melting-point material, for example, a metallic material alone such as silver, aluminum or copper, or a plurality of metallic materials can be suitably used.

When the first electroconductive layer 71 contains the low-melting-point material and the high-melting-point material, the content ratio thereof is appropriately adjusted from the viewpoints of suppression of disconnecting by coarsening of the low-melting-point material as described above, the electroconductivity of the first electroconductive layer, ease of forming an opening section in the insulating layer (increase of the number of origination points for metal deposition on the second electroconductive layer), and so on. The optimum value of the content ratio varies depending on combinations of materials and particle sizes used, but for example, the weight ratio between the low-melting-point material and the high-melting-point material (low-melting-point material high-melting-point material) is set in a range from 5:95 to 67:33. The weight ratio between the low-melting-point material the high-melting-point material is more preferably set from 10:90 to 50:50, further preferably set to from 15:85 to 35:65.

When a particulate low-melting-point material such as metal particles is used as a material of the first electroconductive layer 71, the particle size $D_L$ of the low-melting-point material is preferably no less than 1/20, more preferably no less than 1/10, of the thickness d of the first electroconductive layer, so that a formation of an opening section in the insulating layer in the annealing step is facilitated. The particle size $D_L$ of the low-melting-point material is preferably 0.25 μm or more, more preferably 0.5 μm or more. When the first electroconductive layer 71 is formed by a printing method such as screen printing, the particle size of particles can be appropriately set according to, for example, the mesh size of a screen plate. For example, the particle size is preferably smaller than the mesh size, more preferably no more than 1/2 of the mesh size. When particles are non-spherical, the particle size is defined by the diameter of a circle having an area equal to the projected area of particles (projected area-circle equivalent diameter, Heywood diameter).

The shape of particles of the low-melting-point material is not particularly limited, but is preferably a non-spherical shape such as a flat shape. Non-spherical particles formed by binding spherical particles together by a method such as sintering are also suitably used. In general, when metal particles are brought into a liquid phase state, the surface shape tends to be spherical for reducing surface energy. If the low-melting-point material of the first electroconductive layer before carrying out the annealing step is non-spherical, the amount of change in surface shape of the first electroconductive layer is larger because particles become more spherical when heated to the thermal-fluidization onset temperature $T_1$ or higher in the annealing step. Therefore, it becomes easy to form an opening section in the insulating layer 9 on the first electroconductive layer 71.

As described above, the first electroconductive layer 71 exhibits electroconductivity, and it suffices that its volume resistivity is $10^{-2}$ Ω·cm or less. The volume resistivity of the first electroconductive layer 71 is preferably $10^{-4}$ Ω·m or less. When the first electroconductive layer has only the low-melting-point material, it suffices that the low-melting-point material has electroconductivity. When the first electroconductive layer contains the low-melting-point material and the high-melting-point material, it suffices that at least either one of the low-melting-point material and the highmelting-point material is electroconductive. Examples of the combination of the low-melting-point material/high-melting-point material include: insulating material/electroconductive material; electroconductive material/insulating material; and electroconductive material/electroconductive material. In order to make the first electroconductive layer less resistive, it is preferable that both the low-melting-point material and high-melting-point material be electroconductive materials.

Besides using the combination of the low-melting-point material and the high-melting-point material described above as the material of the first electroconductive layer 71, conversion efficiency may also be improved by adjusting the size of materials (e.g., particle size) and the like to suppress the disconnecting of the first electroconductive layer due to heating in the annealing step. For example, even a material having a high melting point, e.g., silver, copper or gold, in the form of fine particles having a particle size of 1 μm or less, undergoes sintering-necking (fusion of fine particles) at a temperature lower than the melting point, i.e., about 200° C., or a lower temperature $T_1'$, and therefore can be used as the "low-melting-point material" of the present invention. When heated to the sintering-necking onset temperature $T_1'$ or higher, the material that undergoes sintering-necking is deformed at and near the outer periphery of fine particles, so that the surface shape of the first electroconductive layer 71 can be changed to form an opening section in the insulating layer 9. Even when fine particles are heated to the sintering-necking onset temperature or higher, the fine particles retain solid phase state at any temperature that is lower than a melting point $T_2'$, and therefore disconnecting by coarsening of the material as shown in FIG. 9 hardly occurs. In this respect, it can be said that the material that undergoes sintering-necking, such as metal fine particles, has an aspect of the "high-melting-point material" as well while being the "low-melting-point material" in the present invention.

Figure 10A:
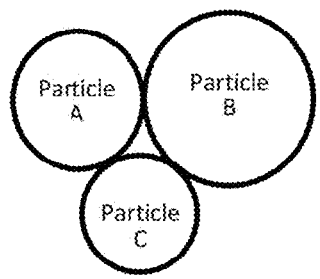
FIGS. 10A, 10B and 10C are conceptual views for explaining a shape change and necking of a low-melting-point material powder during heating.
Figure 10B:
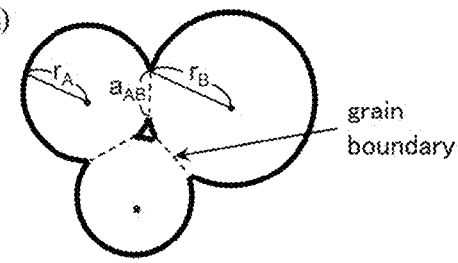
Figure 10C:
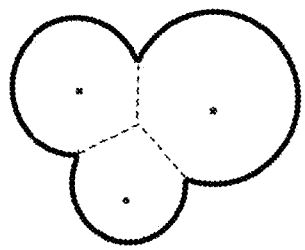

In the material that undergoes sintering-necking, the sintering-necking onset temperature $T_1'$ can be defined as being equal to a thermal-fluidization onset temperature $T_1$. FIGS. 10A to 10C are views for explaining the sintering-necking onset temperature. FIG. 10A is a plan view schematically showing particles before sintering. Particles contact one another at points because they are particles before sintering. FIGS. 10A to 10C are sectional views each schematically showing a state when particles after the onset of sintering are cut along a cross section that passes through the center of each particle. FIG. 10B shows particles after the onset of sintering (initial sintering stage), and FIG. 10C shows a state in which the particles of FIG. 10C are further sintered. In FIG. 10B, the grain boundary between a particle A (radius: $r_A$) and a particle B (radius: $r_B$) is shown by a dotted line segment (length: $a_{AB}$).

Figure 11A:
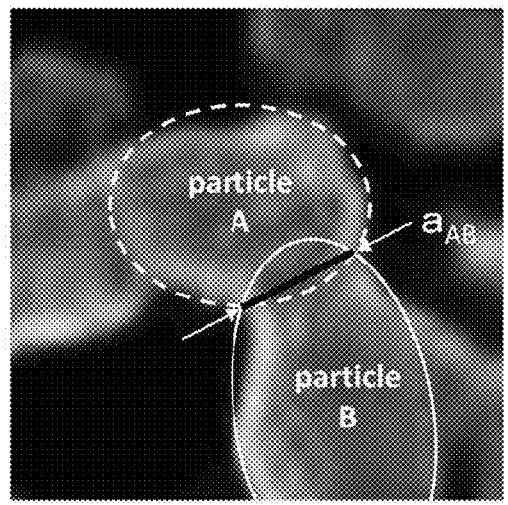
FIGS. 11A and 11B are SEM photographs of metal fine particles in which sintering-necking occurs.
Figure 11B:
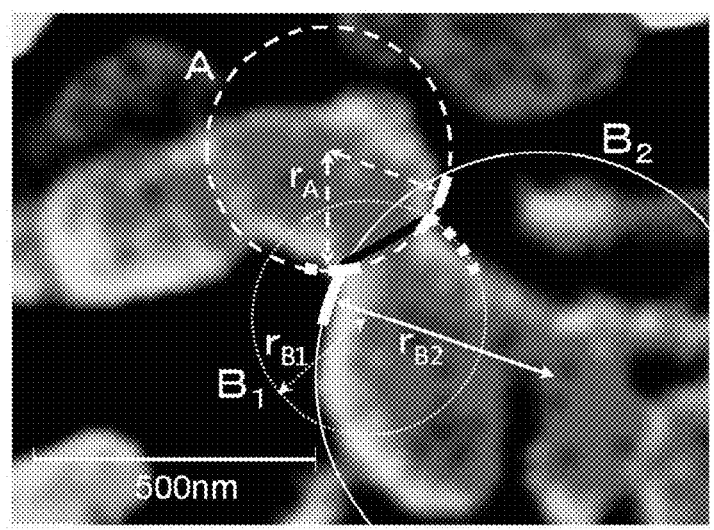

The sintering-necking onset temperature $T_1'$ is defined by a temperature at which the ratio of the length $a_{AB}$ of the grain boundary to max ($r_A$, $r_B$), that is the larger of $r_A$ and $r_B$, $a_{AB}$/max ($r_A$, $r_B$), is 0.1 or more. That is, the temperature, at which $a_{AB}$/max ($r_A$, $r_B$) of at least a pair of particles is 0.1 or more, is referred to as a sintering-necking onset temperature. In FIGS. 10A to 10C, particles are shown as being spherical for simplification, but when particles are not spherical, the curvature radius of a particle near the grain boundary is considered as the radius of the particle. When the curvature radius of the particle near the grain boundary varies depending on the location, the largest curvature radius among measurement points is considered as the radius of the particle. For example, as shown in FIG. 11A, a grain boundary having a length of $a_{AB}$ is formed between a pair of fine particles A and B that undergo sintering. In this case, the shape of the particle A near the grain boundary is approximated by the arc of an imaginary circle A shown in a dashed line. On the other hand, for the shape of the particle B near the grain boundary, one is approximated by the arc of an imaginary circle $B_1$ shown in a dotted line, and the other is approximated by the arc of an imaginary circle $B_2$ shown in a solid line. As shown in FIG. 11B, $r_{B2}$ is larger than $r_{B1}$, and therefore $r_{B2}$ is considered as the radius $r_B$ of the particle B. The aforementioned imaginary circle can be determined by a method in which a boundary is defined by monochromatic binarization processing of an observed image at the cross section or the surface, and central coordinates and a radius are calculated by a least square method based on the coordinates of the boundary near the grain boundary.

When it is difficult to accurately measure the sintering-necking onset temperature based on the aforementioned definition, a first electroconductive layer containing fine particles is formed, an insulating layer is formed thereon, and a temperature, at which an opening section (cracks) is generated in the insulating layer by heating, can be considered as a sintering-necking onset temperature. As mentioned later, when heating is carried out during formation of the insulating layer, the temperature at which an opening section (crack) is generated by heating of the substrate during formation of the insulating layer can be considered as a sintering-necking start temperature.

For the material forming the first electroconductive layer, a paste or the like containing a binder resin or the like can be suitably used, besides the aforementioned low-melting-point material (and the high-melting-point material). To sufficiently improving the electroconductivity of the first electroconductive layer formed by a screen printing method, it is desirable to cure the first electroconductive layer by a heat treatment. Therefore, for the binder resin contained in the paste, a material that can be cured at the aforementioned drying temperature is preferably used, and an epoxy-based resin, a phenol-based resin, an acrylic resin and the like are applicable. This is because in this case, the shape of the low-melting-point material is changed as it is cured, and as shown in FIG. 7 at (D), an opening (cracks) is easily generated in the insulating layer near the low-melting-point material during the heating. It suffices that the ratio between the binder resin and the electroconductive low-melting-point material is set so as to be equal to or more than the so-called percolation threshold (a critical value of a ratio corresponding to the low-melting-point material content at which electroconductivity is exhibited).

The first electroconductive layer 71 can be prepared by a known technique such as an inkjet method, a screen printing method, a conductor wire bonding method, a spray method, a vacuum deposition method, or a sputtering method. The first electroconductive layer 71 is preferably patterned in a specific shape such as a comb-like pattern. For formation of the patterned first electroconductive layer, the screen printing method is suitable to increase productivity. For the screen printing method, a method is suitably used in which a collecting electrode pattern is printed using a printing paste containing a low-melting-point material made of metal particles and a screen plate having an opening pattern matching the pattern shape of the collecting electrode.

On the other hand, when a material containing a solvent is used as a printing paste, a drying step for removing the solvent is required. The drying temperature in this case is preferably lower than the thermal-fluidization onset temperature $T_1$ of the low-melting-point material. The drying time can be appropriately set at, for example, about 5 minutes to 1 hour.

The first electroconductive layer may be composed of a plurality of layers. The first electroconductive layer may have, for example, a layered structure composed of a lower layer having a low contact resistance with a transparent electrode layer on the surface of a photoelectric conversion section and an upper layer containing a low-melting-point material. According to this structure, it can be expected that the fill factor of the solar cell is improved as contact resistance with the transparent electrode layer decreases. It can be expected that the first electroconductive layer is made still less resistive by forming a layered structure of a layer with low-melting-point material and a layer with high-melting-point material.

Explanations have been provided above principally for the case of forming the first electroconductive layer by a printing method, but the method for forming the first electroconductive layer is not limited to the printing method. For example, the first electroconductive layer may be formed by a deposition method or a sputtering method using a mask matching the pattern shape.

(Insulating Layer)

The insulating layer 9 is formed on the first electroconductive layer 71. Herein, when the first electroconductive layer 71 is formed in a specific pattern (e.g., a comb-like pattern), the surface of the first electrode layer 61 has a first electroconductive layer-formed region where the first electroconductive layer is formed, and a first electroconductive layer-non-formed region where no first electroconductive layer is formed. When the insulating region 401 exists on the first principal surface, it is preferable that the insulating layer 9 is formed so as to cover at least a part of the insulating region 401 as described above. For improving the effect of suppressing diffusion of impurities in the plating solution, it is particularly preferable that the whole insulating region 401 is covered with the insulating layer 9.

In the present invention, it is preferable that in formation of the insulating layer 9 on the first electroconductive layer, the whole insulating region 401 on the first principal surface is covered with the insulating layer 9 from the viewpoint of simplification of the production process, etc. On the other hand, when in the insulating layer forming step, a part of the insulating region is covered with the insulating layer 9, and the other part is not covered with the insulating layer, another step may be provided before or after the insulating layer forming step to cover the whole insulating region with the insulating layer.

It is preferable that the insulating layer 9 is formed up to the peripheral end of the first principal surface. When the insulating layer is formed up to the peripheral edge of the first principal surface (i.e., the insulating layer is formed over the whole region of the first principal surface), the first electrode layer 61 can be chemically and electrically protected from a plating solution in formation of the second electroconductive layer by a plating method. Diffusion of impurities in the plating solution to the crystalline silicon substrate can be suppressed, so that improvement of long-term reliability can be expected. When the first electrode layer 61 wraps around to the side surface of the photoelectric conversion section and the peripheral end of the second principal surface, it is preferable that the insulating layer 9 is formed also on the wraparound portion of the first electrode layer for protecting the first electrode layer from the plating solution, and reducing a shading loss resulting from precipitation of a metal on an undesired area such as a side surface.

For example, when the transparent electrode layer 61 is formed on the first principal surface of the photoelectric conversion section 50 as in the heterojunction solar cell shown in FIG. 2, the insulating layer 9 is formed on the surface of the transparent electrode layer 61 to inhibit contact of the transparent electrode layer with a plating solution, so that deposition of a metal layer (second electroconductive layer) onto the transparent electrode layer can be prevented.

It is preferable that the insulating layer 9 is formed also on the side surface of the photoelectric conversion section. If the side surface of the silicon substrate on the side surface of the photoelectric conversion section, wraparound portion of the electrode layer on the side surface or the like is exposed at the time when a plurality of solar cells are connected via an interconnector to modularize the solar cells, an undesired short-circuit may occur due to contact between the side surface and the interconnector, leading to deterioration of the characteristics of the module. When the side surface of the photoelectric conversion section is covered with the insulating layer, such a short-circuit at the side surface is prevented, and therefore conversion efficiency can be improved.

Figure 5D:
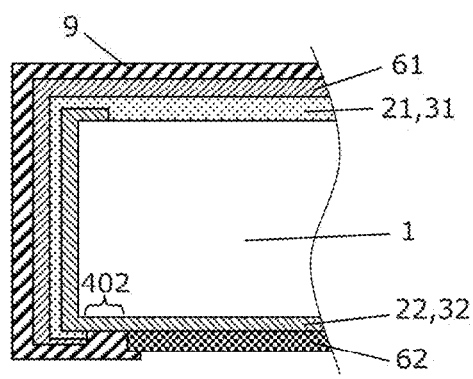
Figure 8:
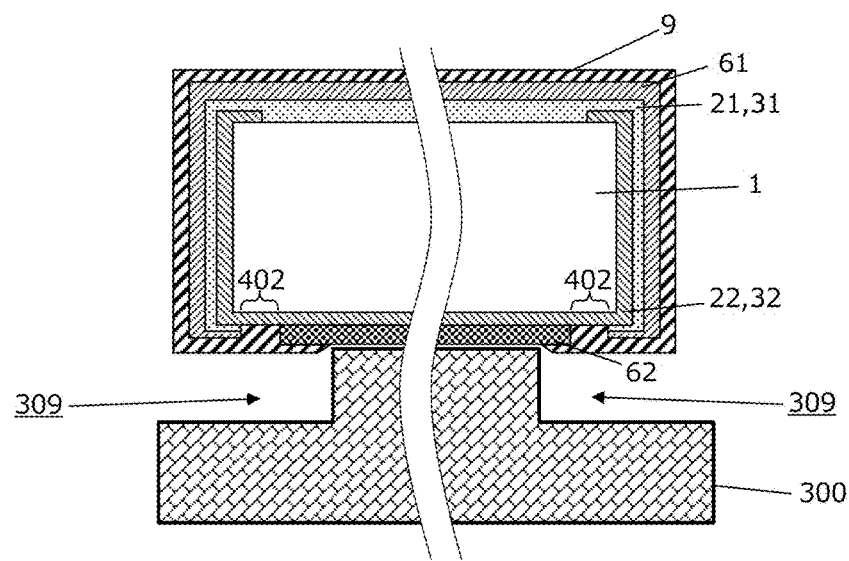
FIG. 8 is a view for explaining the shape of a substrate holder (or bottom electrode) to be used in formation of an insulating layer on an insulating region of a second principal surface.

When the insulating region 402 is provided on the second principal surface, it is preferable that the insulating layer is formed also on the insulating region 402 due to wraparound in formation of the insulating layer 9 on the first principal surface, and it is particularly preferable that the insulating layer 9 is formed so as to cover the whole insulating region 402 as shown in FIG. 5D. For example, by providing gaps in the vicinity of the insulating region 402 of the second principal surface in formation of the insulating layer 9 on the first principal surface by a sputtering method or a CVD method, the insulating layer forming material is easily supplied onto the insulating region 402, and therefore the amount of the insulating layer extending and wrapping around to the peripheral edge of the second principal surface can be increased. For example, when a substrate holder 300 having a projected portion as shown in FIG. 8 is provided, and the crystalline silicon substrate 1 is placed on the projected portion of the substrate holder in such a manner that the insulating region 402 is not in contact with the substrate holder, gaps 309 are provided in the vicinity of the insulating region 402. In the case where the insulating layer 9 is formed by a CVD method, gaps 309 can also be provided in the vicinity of the insulating region 402 by placing the substrate on the bottom electrode (electrode on the substrate side) 300 having a projected portion. Another step may be provided before or after the insulating layer forming step to provide the insulating layer on the insulating region 402 on the second principal surface.

As the material of the insulating layer 9, a material that is electrically insulating is used. It is desirable that the insulating layer 9 be a material having chemical stability to a plating solution. By using a material having high chemical stability to a plating solution, problems such as denaturation of the insulating layer, for example, by dissolution and peeling of the layer hardly occur in a plating step during formation of the second electroconductive layer, so that damage to the surface of the photoelectric conversion section is hindered. When the insulating layer 9 is formed on the first electroconductive layer-non-formed region as well, the insulating layer preferably has high adhesive strength with the photoelectric conversion section 50. For example, in the heterojunction solar cell, the insulating layer 9 preferably has high adhesive strength with the transparent electrode layer 61 on the surface of the photoelectric conversion section 50. By increasing adhesive strength between the transparent electrode layer and the insulating layer, the insulating layer becomes hard to peel off during the plating step, so that deposition of a metal onto the transparent electrode layer can be prevented.

For the insulating layer 9, a material having low optical absorption is preferably used. The insulating layer 9 is formed on the light incident surface of the photoelectric conversion section 50, and therefore if optical absorption by the insulating layer is low, a larger amount of light can be introduced into the photoelectric conversion section. For example, when the insulating layer 9 has sufficient transparency with a transmittance of 90% or more, the optical loss at the insulating layer by optical absorption is low, the solar cell can be provided for a practical use without removing the insulating layer after forming the second electroconductive layer. Consequently, the process for manufacturing the solar cell can be simplified, so that productivity can be further improved. When a solar cell is provided for a practical use without removing the insulating layer 9, it is desirable that a material having sufficient weather resistance and stability to heat/humidity in addition to transparency is used for forming the insulating layer 9.

The material of the insulating layer may be an inorganic insulating material or an organic insulating material. As the inorganic insulating material, a material such as silicon oxide, silicon nitride, titanium oxide, aluminum oxide, magnesium oxide or zinc oxide can be used. As the organic insulating material, a material such as polyester, an ethylene-vinyl acetate copolymer, acrylic, epoxy or polyurethane can be used. The material of the insulating layer is preferably an inorganic material having a low elongation at break, so that formation of an opening in the insulating layer, which occurs as the surface shape of the first electroconductive layer changes by stress or the like at the interface, in the annealing step is facilitated. Among these inorganic materials, silicon oxide, silicon nitride, silicon oxynitride, aluminum oxide, sialon (SiAlON), yttrium oxide, magnesium oxide, barium titanate, samarium oxide, barium tantalate, tantalum oxide, magnesium fluoride, titanium oxide, strontium titanate or the like is suitably used from the viewpoints of resistance to a plating solution and transparency of the material. Above all, silicon oxide, silicon nitride, silicon oxynitride, aluminum oxide, sialon (SiAlON), yttrium oxide, magnesium oxide, barium titanate, samarium oxide, barium tantalate, tantalum oxide, magnesium fluoride or the like is preferable from the viewpoints of electrical characteristics, adhesiveness with the transparent electrode layer, and so on, and silicon oxide, silicon nitride or the like is especially suitably used to adjust the refractive index appropriately. These inorganic materials are not limited to those having a stoichiometric composition, but may be those having oxygen-deficiencies.

The thickness of the insulating layer 9 may be set appropriately, according to the material of the insulating layer and method of formation thereof. The thickness of the insulating layer 9 is preferably so thin that an opening section can be formed in the insulating layer by stress or the like at the interface, which occurs as the surface shape of the first electroconductive layer is changed in the annealing step. Accordingly, the thickness of the insulating layer 9 is preferably 1000 nm or less, more preferably 500 nm or less. By appropriately setting the optical characteristics and thickness of the insulating layer 9 in a first electroconductive layer-non-formed region, light reflection characteristics are improved, and the amount of light introduced into the solar cell is increased, so that conversion efficiency can be further improved. For obtaining this effect, the refractive index of the insulating layer 9 is preferably lower than the refractive index of the surface of the photoelectric conversion section 50. In order to impart suitable antireflection characteristics to the insulating layer 9, the thickness is preferably set within a range of 30 nm to 250 nm, and more preferably set within a range of 50 nm to 250 nm. The thickness of the insulating layer on the first electroconductive layer-formed region and the thickness of the insulating layer on the first electroconductive layer-non-formed region may be mutually different. For example, the thickness of the insulating layer may be set so as to facilitate a formation of an opening section in the annealing step as to the first electroconductive layer-formed region, and the thickness of the insulating layer may be set so as to have an optical thickness with appropriate antireflection characteristics as to the first electroconductive layer-non-formed region. The insulating region of the first electroconductive layer non-formed region may be set so that the thickness of the insulating layer is larger than that in the first electroconductive layer-formed region, so that the surface of the silicon substrate is reliably protected from a plating solution.

To enhance an anti-reflection effect at the interface of the transparent electrode layer (the refractive index of which is generally about 1.9 to 2.1) on the first principal surface (light incident surface) of the photoelectric conversion section 50 thereby increasing an amount of light introduced into the solar cell, the refractive index of the insulating layer is preferably an intermediate value between the refractive index of air (1.0) and the refractive index of the transparent electrode layer. When the solar cells are sealed to be modularized, the refractive index of the insulating layer is preferably an intermediate value between the refractive index of a sealing material and the refractive index of the transparent electrode layer. Accordingly, the refractive index of the insulating layer 9 is, for example, preferably 1.4 to 1.9, more preferably 1.5 to 1.8, further preferably 1.55 to 1.75. The refractive index of the insulating layer can be adjusted to fall within a desired range according to the material, composition and the like of the insulating layer. For example, in the case of silicon oxide, the refractive index is increased by decreasing the oxygen content. Unless otherwise specified, the refractive index in this specification is a refractive index to light having a wavelength of 550 nm and a value measured by spectroscopic ellipsometry. The optical thickness (refractive index×thickness) of the insulating layer is preferably set according to the refractive index of the insulating layer so that anti-reflection characteristics are improved.

The insulating layer can be formed using a known method. For example, in the case of an inorganic insulating material such as silicon oxide or silicon nitride, a dry process such as a plasma-enhanced CVD method or a sputtering method is suitably used. In the case of an organic insulating material, a wet process such as a spin coating method or a screen printing method is suitably used. By these methods, a film of a densified structure having reduced defects such as pinholes can be formed.

Among the above-described deposition methods, a method capable of forming an insulating layer on the side surface of the photoelectric conversion section as well as on the first principal surface is suitably used. As the method in which an insulating layer is formed also on the side surface of the substrate, a CVD method, a sputtering method or the like is preferable. Above all, the insulating layer 9 is preferably formed by the plasma-enhanced CVD method so as to form a film having a more densified structure. By this method, a film having a structure with high density can be formed even when an insulating layer having a small thickness of ca. 30 to 100 nm, as well as a large thickness of about 200 nm, is formed.

When the photoelectric conversion section 50 has on its surface a textured structure (uneven structure), the insulating layer is preferably formed by the plasma-enhanced CVD method so that a densified film may be formed even at recessed and raised portions of the texture. By using an insulating layer having high density, damage to the transparent electrode layer during a plating treatment can be reduced, and also deposition of a metal onto the transparent electrode layer can be prevented. In addition, the insulating layer also has an excellent function as a protective film for preventing diffusion of impurities such as copper ions from the insulating region into the silicon substrate 1. Further, the insulating layer having high density can function as a barrier layer to water, oxygen and the like for a layer within the photoelectric conversion section 50 (silicon-based thin-film) such as the silicon-based thin-films 31 and 32 in the crystalline silicon-based solar cell in FIG. 2, so that an effect of improving long-term reliability of the solar cell can also be expected.

The shape of the insulating layer 9 between the first electroconductive layer 71 and the second electroconductive layer 72, i.e., the insulating layer on the first electroconductive layer-formed region, does not have to be necessarily a seamless layer, but may be an island layer. The term "island" in this specification means a state in which a non-formed region, on which no insulating layer 9 is formed, is provided at a part of the surface.

In the present invention, the insulating layer 9 can also contribute to improvement of adhesive strength between the first electroconductive layer 71 and the second electroconductive layer 72. For example, when a Cu layer is formed on an Ag layer as an under-layer electrode by a plating method, adhesive strength between the Ag layer and the Cu layer is low. It can be expected, on the other hand, that the adhesive strength of the second electroconductive layer is increased to improve the reliability of the solar cell as a result of formation of the Cu layer on an insulating layer of silicon oxide or the like.

In one embodiment of the present invention, the annealing step is carried out after the insulating layer 9 is formed on the first electroconductive layer 71 and before the second electroconductive layer 72 is formed. In the annealing step, the first electroconductive layer 71 is heated to a temperature higher than the thermal-fluidization onset temperature $T_1$ of the low-melting-point material, and the low-melting-point material is fluidized, so that the surface shape of the first electroconductive layer is changed. In association with this change, the opening section 9h is formed in the insulating layer 9 on the first electroconductive layer. Therefore, in the subsequent plating step, a part of the surface of the first electroconductive layer 71 is exposed to a plating solution for conducting electricity, thus making it possible to deposit a metal (second electroconductive layer) on the conducting part as origination point as shown in FIG. 7 at (E).

The opening section is formed principally on the low-melting-point material 711 of the first electroconductive layer 71. When the low-melting-point material is an insulating material, a part immediately below the opening section is insulating, but a plating solution is also penetrated into the electroconductive high-melting-point material present on the periphery of the low-melting-point material, and therefore a conductive connection can be established between the first electroconductive layer and the plating solution.

The annealing temperature (heating temperature) Ta in the annealing step is preferably higher than the thermal-fluidization onset temperature $T_1$ of the low-melting-point material, i.e., $T_1<Ta$. The annealing temperature Ta more preferably satisfies $T_1+1°$ C.$\leq Ta \leq T_1+100°$ C., and further preferably satisfies $T_{1+5}°$ C.$\leq Ta \leq T_1+60°$ C. The annealing temperature can be appropriately set according to the composition and content of the material of the first electroconductive layer, and so on.

The annealing temperature Ta is preferably lower than the heat-resistant temperature of the photoelectric conversion section 50 and the first electrode layer 61 as described above. The heat-resistant temperature of the photoelectric conversion section varies depending on the configuration of the photoelectric conversion section. For example, when an amorphous silicon thin-film is provided as in the heterojunction solar cell or the silicon-based thin-film solar cell, the heat-resistant temperature is about 250° C.$\leq$Thus, in the case of the heterojunction solar cell or the silicon-based thin-film solar cell, in which the photoelectric conversion section includes an amorphous silicon-based thin-film, the annealing temperature is preferably set at 250° C. or lower so that thermal damage at the amorphous silicon-based thin-film and the interface thereof are suppressed. For achieving a solar cell having higher performance, the annealing temperature is more preferably 200° C. or lower, further preferably 180° C. or lower. In association therewith, the thermal-fluidization onset temperature $T_1$ of the low-melting-point material of the first electroconductive layer 71 is preferably lower than 250° C., more preferably lower than 200° C., further preferably lower than 180° C.

The method for forming an opening section in an insulating layer is not limited to a method in which an annealing treatment is performed after formation of an insulating layer as described above. For example, the opening section 9h can be formed almost simultaneously with the formation of the insulating layer 9, as shown by the dotted-line arrow in FIG. 7.

For example, when the insulating layer is formed while the substrate is heated, an opening section is formed almost simultaneously with formation of the insulating layer. Here, the term "almost simultaneously with formation of the insulating layer" means a state in which a step other than the insulating layer forming step, such as an annealing treatment, is not performed. In other words, "almost simultaneously with formation of the insulating layer" means a state during or immediately after formation of the insulating layer. The term "immediately after formation" also includes a duration until the substrate is cooled to room temperature etc. after formation of the insulating layer is completed (after heating is stopped). Formation of an opening section in the insulating layer on the low-melting-point material also includes a situation in which even after formation of the insulating layer on the low-melting-point material is completed, the insulating layer on the periphery of the low-melting-point material is deformed as the insulating layer is formed on the periphery thereof, so that an opening section is formed.

As a method for forming an opening section almost simultaneously with formation of the insulating layer, for example, a method is used in which the insulating layer 9 is formed on the first electroconductive layer 71 while the substrate is heated to a temperature Tb higher than the thermal-fluidization onset temperature $T_1$ of a low-melting-point material 711 of the first electroconductive layer 71 in the insulating layer forming step. Since the insulating layer 9 is formed on the first electroconductive layer with the low-melting-point material in a fluidized state, stress is generated at a deposition interface concurrently with deposition, so that, opening like a crack, for example, is formed in the insulating layer.

The substrate temperature Tb during formation of the insulating layer (hereinafter, referred to as an "insulating layer forming temperature") refers to a substrate surface temperature at the start of formation of the insulating layer (also referred to as a "substrate heating temperature"). Generally, the mean value of the substrate surface temperature during the formation of the insulating layer is equal to or higher than the substrate surface temperature at the start of deposition. Therefore, when the insulating layer forming temperature Tb is higher than the thermal-fluidization onset temperature $T_1$ of the low-melting-point material, a deformed portion such as an opening section can be formed in the insulating layer.

For example, when the insulating layer 9 is formed by a dry process such as a CVD method or a sputtering method, an opening section can be formed by ensuring that the substrate surface temperature during formation of the insulating layer is higher than the thermal-fluidization onset temperature $T_1$ of the low-melting-point material. When the insulating layer 9 is formed by a wet method such as coating, an opening section can be formed by ensuring that the substrate surface temperature at the time of drying a solvent is higher than the thermal-fluidization onset temperature $T_1$ of the low-melting-point material. The "deposition starting time point" when the insulating layer is formed by a wet method refers to a time point at which drying of a solvent is started. A preferred range of the insulating layer forming temperature Tb is similar to the preferred range of the annealing temperature Ta.

For example, the substrate surface temperature can be measured with a thermo label or a thermocouple attached to the substrate surface on the deposition surface. The temperature of heating means such as a heater should be appropriately adjusted so that the surface temperature of the substrate falls within a desired range.

When the insulating layer 9 is formed by a plasma-enhanced CVD method, the insulating layer forming temperature Tb is preferably 130° C. or higher, more preferably 140° C. or higher, further preferably 150° C. or higher for forming a dense film. The maximum achieving temperature of the substrate surface during formation of the insulating layer is preferably lower than the heat-resistant temperature of the photoelectric conversion section.

The deposition rate in plasma-enhanced CVD is preferably 1 nm/second or less, more preferably 0.5 nm/second or less, further preferably 0.25 nm/second or less for forming a denser film. When silicon oxide is formed by plasma-enhanced CVD, the deposition conditions preferably include a substrate temperature of 145° C. to 250° C., a pressure of 30 Pa to 300 Pa and a power density of 0.01 W/cm² to 0.16 W/cm².

When an opening section is formed almost simultaneously with formation of the insulating layer and there are locations where formation of the opening is insufficient, etc., the above-described annealing step may be further performed after the formation of the insulating layer.

(Second Electroconductive Layer)

After the insulating layer 9 having the opening section 9h is formed as described above, the second electroconductive layer 72 is formed on the insulating layer 9 of the first electroconductive layer-formed region by a plating method. At this time, the metal deposited as the second electroconductive layer is not particularly limited as long as it is a material that can be formed by a plating method, and for example, copper, nickel, tin, aluminum, chromium, silver, gold, zinc, lead, palladium or the like, or a mixture thereof can be used.

Electric current principally passes through the second electroconductive layer during operation (electricity generation) of the solar cell. Thus, the line resistance of the second electroconductive layer is preferably as low as possible so as to suppress the resistance loss in the second electroconductive layer. Specifically, the line resistance of the second electroconductive layer is preferably 1 Ω/cm or less, more preferably 0.5 Ω/cm or less. On the other hand, it suffices that the line resistance of the first electroconductive layer is so low that the layer can function as an underlying layer at the time of electroplating, with an example thereof being 5 Ω/cm or less.

Although the second electroconductive layer can be formed by either of an electroless plating method and an electroplating method, the electroplating method is suitably used in order to increase productivity. In the electroplating method, the rate of deposition of a metal can be increased, so that the second electroconductive layer can be formed in a short time. In the case where the second electroconductive layer is formed by an electroplating method, the first electroconductive layer is connected to a power source through an appropriate holder, and a voltage is applied between the anode and the first electroconductive layer, whereby copper can be selectively precipitated on the first electroconductive layer which is not covered with the insulating layer 9, i.e., on the first electroconductive layer-formed region with the opening section 9h of the insulating layer 9 as an origination point.

The plating solution used for acidic copper plating contains copper ions. For example, a solution of known composition, which has copper sulfate, sulfuric acid and water as main components, can be used, and by causing a current of 0.1 to 10 A/dm² to pass therethrough, a metal as the second electroconductive layer can be deposited. The suitable plating time is appropriately set according to the area of a collecting electrode, the current density, cathode current efficiency, desired thickness and so on.

The second electroconductive layer may be composed of a plurality of layers. For example, by forming a first plating layer, made of a material having a high electroconductivity, such as Cu, on the first electroconductive layer with an insulating layer interposed therebetween, and then forming on the surface of the first plating layer a second plating layer excellent in chemical stability, a collecting electrode having low resistance and being excellent in chemical stability can be formed.

It is preferable that after carrying out the plating step, a plating solution removing step be provided to remove a plating solution remaining on the surface of the substrate. By providing the plating solution removing step, a metal that can be deposited at a part, other than at the opening section 9h of the insulating layer 9 formed in the annealing step, as an origination point can be removed. Examples of the metal deposited at a part other than at the opening section 9h as an origination point include those deposited at a pinhole in the insulating layer 9 as an origination point. As a result of removing such a metal by the plating solution removing step, the shading loss is reduced, and solar cell characteristics can be further improved.

Removal of the plating solution can be performed by, for example, a method in which plating solution remaining on the surface of the substrate taken out from a plating tank is removed by air blow-type air washing, rinsing is then carried out, and a washing fluid is blown off by air blow. By reducing the amount of plating solution remaining on the surface of the substrate by carrying out air washing before rinsing, the amount of the plating solution brought in at the time of rinsing can be decreased. Therefore, the amount of washing fluid required for rinsing can be decreased, and time and effort for waste liquid treatment associated with rinsing can also be reduced, so that environmental burdens and expenses resulting from washing are reduced, and productivity of the solar cell can be improved.

The contact angle of the surface of the first electrode layer 61 with water is preferably 20° or more for facilitating removal of a plating solution. For increasing the contact angle at the surface of the substrate, the surface of the substrate may be subjected to a water-repellent treatment. The water-repellent treatment is performed by, for example, forming a water-repellent layer on the surface. By the water-repellent treatment, wettability of the surface of the substrate to a plating solution can be reduced. In place of the water-repellent treatment of the surface of the insulating layer 9, the insulating layer 9 having water repellency may be formed.

In the present invention, an insulating layer removing step may be carried out after forming the collecting electrode (plating step). For example, when a material having large optical absorption is used as the insulating layer, the insulating layer removing step is preferably carried out for suppressing reduction of solar cell characteristics by the optical absorption of the insulating layer. The method for removing the insulating layer is appropriately selected according to the characteristics of the insulating layer material. For example, the insulating layer can be removed by chemical etching or mechanical polishing. An ashing (incineration) method is also applicable depending on the material. At this time, it is preferable that the insulating layer on the first electroconductive layer-non-formed region is entirely removed, so that an influx of light is further improved. When a material having small optical absorption such as silicon oxide is used as the insulating layer, it is not necessary to carry out the insulating layer removing step.

Explanations have been provided principally for the case of providing the collecting electrode 70 on the light incident side of the heterojunction solar cell, but a similar collecting electrode may also be formed on the back side (on the second electrode layer). A solar cell using a crystalline silicon substrate, like the heterojunction solar cell, has a high current value, so that generally the electricity generation loss due to contact resistance between the transparent electrode layer and the collecting electrode tends to be remarkable. In contrast, the collecting electrode having the first electroconductive layer and the second electroconductive layer has low contact resistance with the transparent electrode layer, thus making it possible to reduce the electricity generation loss resulting from contact resistance.

The present invention is applicable not only to heterojunction solar cells, but also to various solar cells including a transparent electrode layer and a collecting electrode on a first principal surface (light incident side) of a photoelectric conversion section, and an electrode layer on a second principal surface of the photoelectric conversion section. Solar cell having such configuration may be a solar cell having various kinds of semiconductor junction as the photoelectric conversion section. Examples thereof include crystalline silicon solar cells other than the heterojunction solar cell; solar cells using a semiconductor substrate other than silicon, such as GaAs; silicon-based thin-film solar cells having an electrode layer on a pin junction or a pn junction of an amorphous silicon-based thin-film or a crystalline silicon-based thin-film, compound semiconductor solar cells such as CIS and CIGS. The present invention is also applicable to organic thin-film solar cells, such as dye-sensitized solar cells and organic thin-film (electroconductive polymer).

The solar cell of the present invention is preferably modularized when put into practical use. Modularization of the solar cell is performed by an appropriate method. For example, by connecting a bus bar via an interconnector such as a TAB to a collecting electrode, a plurality of solar cells are connected in series or in parallel, and sealed by a sealing material and a glass plate to thereby perform modularization. Particularly, when the insulating layer is formed on the front surface and the side surface of the substrate, a short circuit at the time of modularization is inhibited, resulting in excellent productivity in the modularization step.

EXAMPLES

The present invention will be more specifically described below by showing examples relating to the heterojunction solar cell, but the present invention is not limited to the Examples below.

Example 1

In Example 1, an electrode layer was formed using the method shown in FIGS. 4B and 4C, and thereafter a collecting electrode was formed using the method shown in FIG. 7.

(Formation of Photoelectric Conversion Section)

An n-type single-crystalline silicon wafer having a light incident surface direction identical to the (100) surface and having a thickness of 200 μm was provided as a single-crystalline silicon substrate of a first conductivity type. The silicon wafer was immersed in a 2 wt % aqueous HF solution for 3 minutes to remove silicon oxide covering on the surface, and thereafter rinsed twice with ultrapure water. The silicon substrate was immersed in a 5/15 wt % aqueous KOH/isopropyl alcohol solution held at 70° C. for 15 minutes, and the surface of the wafer was etched to form a textured surface. Thereafter, the wafer was rinsed twice with ultrapure water.

The textured wafer was introduced into a CVD apparatus, and at the light incident side thereof (first principal surface), i-type amorphous silicon was formed with a thickness of 5 nm as an intrinsic silicon-based thin-film. Conditions for forming i-type amorphous silicon included a substrate temperature of 170° C., a pressure of 120 Pa, a $SiH_4/H_2$ flow ratio of 3/10 and a power density supply of 0.011 $W/cm^2$. The thickness of the thin-film in this example is a value calculated from a formation rate determined by measuring the thickness of a thin-film formed on a glass substrate under the same conditions using a spectroscopic ellipsometry (trade name: M2000, manufactured by J.A. Woollam Co. Inc.).

On the i-type amorphous silicon layer, p-type amorphous silicon was formed with a thickness of 7 nm as a conductive silicon-based thin-film. Conditions for forming the p-type amorphous silicon layer included a substrate temperature of 150° C., a pressure of 60 Pa, a $SiH_4/B_2H_6$ flow ratio of 1/3 and a power density supply of 0.01 $W/cm^2$. The $B_2H_6$ gas flow rate mentioned above is a flow rate of a diluting gas wherein $B_2H_6$ concentration was diluted to 5000 ppm using $H_2$ gas.

Thereafter, on the back side (second principal surface) of the wafer, an i-type amorphous silicon layer was formed with a thickness of 6 nm as an intrinsic silicon-based thin-film. Conditions for forming the i-type amorphous silicon layer on the second principal surface were the same as those for the aforementioned i-type amorphous silicon layer on the first principal surface. On the i-type amorphous silicon layer, an n-type amorphous silicon layer was formed with a thickness of 8 nm as a conductive silicon-based thin-film. Conditions for forming the n-type amorphous silicon layer 3b included a substrate temperature of 150° C., a pressure of 60 Pa, a $SiH_4/PH_3$ flow ratio of 1/2 and a power density supply of 0.01 W/cm². The $PH_3$ gas flow rate mentioned above is a flow rate of a diluting gas wherein $PH_3$ concentration was diluted to 5000 ppm using $H_2$ gas.

(Formation of Electrode Layers)

An insulating region was formed on the first principal surface by shielding the peripheral edge with a mask during formation of the transparent electrode layer on the first principal surface. As a first electrode layer (transparent electrode layer), indium tin oxide (ITO, refractive index: 1.9) was deposited with a thickness of 100 nm on the p-type amorphous silicon on the first principal surface. In formation of the first electrode layer, a region extending over a distance of 1 mm from the peripheral end of the wafer was shielded with a mask to ensure that the transparent electrode layer was not formed at the peripheral end and on the side surface. The transparent electrode layer was formed by applying a power density of 0.5 W/cm² in an argon atmosphere at a substrate temperature of room temperature and a pressure of 0.2 Pa using a compound sintered compact of indium oxide and tin oxide as a target.

As a second electrode layer, ITO (transparent electrode) with a thickness of 100 nm and silver (metal electrode layer) with a thickness of 500 nm were formed on the n-type amorphous silicon on the second principal surface by a sputtering method. During formation of the second electrode layer, a mask was not used, and the electrode layer was formed on the whole of the second principal surface and the side surface of the substrate.

A collecting electrode including a first electroconductive layer and a second electroconductive layer, and an insulating layer interposed therebetween was formed on the first electrode layer in accordance with the following procedure.

(Formation of First Electroconductive Layer)

For formation of the first electroconductive layer, a printing paste containing SnBi metal powder (particle size $D_L=25$ to 35 μm; melting point $T_{1=141}$° C.) as a low-melting-point material and a silver powder (particle size $D_H=2$ to 3 μm; melting point $T_{2=971}$° C.) as a high-melting-point material at a weight ratio of 20:80, and further containing an epoxy-based resin as a high melting-point material binder resin was used. The printing paste was screen-printed using a screen plate of #230 mesh (opening width: l=85 μm) having an opening width (L=80 μm) matching a collecting electrode pattern, and dried at 90° C.

(Formation of Insulating Layer)

The wafer with the first electroconductive layer formed on the first electrode layer (transparent electrode layer) was introduced into a CVD apparatus, and a silicon oxide layer (refractive index: 1.5) was formed on the light incident surface with a thickness of 120 nm as an insulating layer by a plasma-enhanced CVD method. Conditions for forming the insulating layer included a substrate temperature of 135° C., a pressure of 133 Pa, a $SiH_4/CO_2$ flow ratio of 1/20 and a power density supply of 0.05 W/cm² (frequency 13.56 MHz). Thereafter, the wafer after formation of the insulating layer was introduced into a circulating hot air oven, and subjected to an annealing treatment at 180° C. for 20 minutes in an air atmosphere.

The substrate subjected to steps up to and including the annealing step as described above was introduced into a plating tank. For a plating solution in the plating tank, one obtained by adding additives (product numbers: ESY-2B, ESY-H and ESY-1A, manufactured by C. Uyemura & CO., LTD.) to a solution prepared so that the concentrations of copper sulfate pentahydrate, sulfuric acid and sodium chloride were 120 g/l, 150 g/l and 70 mg/l, respectively, was used. Plating was carried out under conditions including a temperature of 40° C. and a current of 3 A/dm², so that on the insulating layer on the first electroconductive layer, copper was uniformly deposited at a thickness of about 10 μm as a second electroconductive layer. Little copper was deposited onto a region where no first electroconductive layer was formed.

Example 2

In Example 2, a mask was not used during formation of a transparent electrode layer on a first principal surface, and the transparent electrode layer and a metal electrode layer were formed while a region extending over a distance of 1 mm from the peripheral end of a wafer on a second principal surface was shielded with a mask, thereby forming an insulating region on the second principal surface. Otherwise the same procedure as in Example 1 was carried out to form a collecting electrode on the transparent electrode layer on the first principal surface.

Comparative Example 1

In Comparative Example 1, deposition was performed while a region extending over a distance of 1 mm from the peripheral end of a wafer on a first principal surface and a second principal surface was shielded with a mask during formation of a transparent electrode layer on the first principal surface and during formation of a transparent electrode layer and a metal electrode layer on the second principal surface. Otherwise the same procedure as in Example 1 was carried out to form a collecting electrode on the transparent electrode layer on the first principal surface.

Comparative Example 2

In Comparative Example 2, a mask was not used either during formation of a transparent electrode layer on a first principal surface or during formation of a transparent electrode layer and a metal electrode layer on a second principal surface. Otherwise the same procedure as in Example 1 was carried out to form the transparent electrode layer on the first principal surface of a photoelectric conversion section, and form the transparent electrode layer and the metal electrode layer on the second principal surface of the photoelectric conversion section. Thereafter, the same procedure as in Example 1 was carried out to form a first electroconductive layer on the transparent electrode layer on the first principal surface.

(Formation of Insulating Region: Cleavage of Silicon Wafer)

A wafer with a first electroconductive layer formed on a transparent electrode layer was transferred to a laser processing apparatus, and a groove was formed over the entire circumference of the peripheral edge of the wafer (a range of about 1 mm from the peripheral end of the wafer) by laser light. A YAG third harmonic laser (wavelength: 355 nm) was used as laser light, and the depth of the groove was made equal to about one third of the thickness of the wafer. Subsequently, the wafer was bent along the groove, and cleaved at the end portion to remove the outer peripheral portion of the wafer. Through this process, an insulating region on which any of the silicon-based thin-film, the transparent electrode layer and the metal electrode was deposited was formed on the side surface of the wafer.

Thereafter, the same procedure as in Example 1 was carried out to form an insulating layer over the whole first principal surface, and a second electroconductive layer was formed by a plating method after annealing treatment.

Comparative Example 3

In Comparative Example 3, as in the case of Example 1, a mask was used during formation of a transparent electrode layer on a first principal surface, and a mask was not used during formation of a transparent electrode layer and a metal electrode layer on a second principal surface. Steps up to and including formation of the first electroconductive layer (silver electrode) 71 were carried out in the same manner as in Example 1 except that a silver paste containing no low-melting-point material (i.e., the ratio of a metallic material powder to a silver powder was 0:100) was used as a printing paste for formation of a first electroconductive layer. Thereafter, a crystalline silicon-based solar cell with the silver electrode as a collecting electrode was prepared while none of the formation of the insulating layer, the annealing and plating was performed.

[Evaluation]

The crystalline silicon-based solar cells of the Examples and Comparative Examples obtained in the manner described above were irradiated with pseudo sunlight at an energy density of 100 mW/cm$^2$ under 25° C. using a solar simulator having a spectrum distribution of AM 1.5, so that solar cell characteristics were measured. Output characteristics (open circuit voltage (Voc), short circuit current (Isc), fill factor (FF) and maximum output power (Pmax)) of each solar cells are shown in Table 1.

Comparison of Example 1 with Comparative Example 3 shows that the crystalline silicon-based solar cell of the present invention has improved maximum output power (Pmax) as compared to one having conventional collecting electrode using only a silver paste. This is considered to be mainly because the second electroconductive layer was formed with an under-layer of the first electroconductive layer, and therefore the resistance of the collecting electrode was lowered, so that the fill factor (FF) was improved.

Comparative Example 1 in which a mask was used in both the formation of the electrode layer on the first principal surface and the formation of the electrode layer on the second principal surface showed a smaller fill factor (FF) and current (Isc) as compared to Examples 1 and 2. This is considered to be because since the electrode layer was not formed at the peripheral end and on the side surface, the carrier collection efficiency decreased. Comparative Example 1 required alignment of the mask both during formation of the first electrode layer and during formation of the second electrode layer, and was therefore inferior in productivity as compared to Examples 1 and 2.

Comparative Example 2 in which the substrate was cleaved at the end portion to remove a short-circuit between the first electrode layer and the second electrode layer showed a smaller current (Isc) as compared to Examples 1 and 2. This is considered to be because since the substrate was cleaved at the end portion, the effective area of the solar cell decreased.

Example 1 in which an insulating region existed on the first principal surface showed an increased fill factor (FF) in particular. This is considered to be because since the insulating region and the first electrode layer (transparent electrode layer) on the first principal surface are covered with the insulating layer and protected, ingress of impurities from the plating solution in formation of the second electroconductive layer by a plating method is suppressed, leakage at the periphery of the insulating region is suppressed, and so on.

Example 2 in which an insulating region existed on the second principal surface showed an increased current value (Isc) in particular. This is considered to be because since a metal electrode layer is not formed on the side surface of the photoelectric conversion section, light from the side surface

TABLE 1

| | insulating process | | | | second electroconductive layer | Conversion Characteristics | | | |
|---|---|---|---|---|---|---|---|---|---|
| | first principal surface (light incident surface) | second principal surface (back surface) | insulating region | reference drawing | | Voc (V) | Isc (A) | FF (%) | Pmax (W) |
| Example 1 | mask deposition | deposited on whole surface | first principal surface | FIGS. 4A to 4C | present | 0.718 | 8.58 | 77.0 | 4.74 |
| Example 2 | deposited on whole surface | mask deposition | second principal surface | FIGS. 5A to 5D | present | 0.718 | 8.73 | 75.8 | 4.75 |
| Comparative Example 1 | mask deposition | mask deposition | both surfaces | | present | 0.718 | 8.58 | 76.4 | 4.71 |
| Comparative Example 2 | deposited on whole surface | deposited on whole surface | side surface (cleaved) | | present | 0.716 | 8.54 | 76.5 | 4.68 |
| Comparative Example 3 | mask deposition | deposited on whole surface | first principal surface | | absent | 0.718 | 8.44 | 74.3 | 4.51 | can be taken in the photoelectric conversion section and made to contribute to power generation.

As described above using Examples, according to the present invention, a collecting electrode of a solar cell can be prepared by a plating method while ingress of impurities into a silicon substrate is suppressed, thus making it possible to provide a high-power solar cell at low costs.

DESCRIPTION OF REFERENCE CHARACTERS 1 crystalline silicon substrate
21, 22 intrinsic silicon-based thin-films
31, 32 conductive silicon-based thin-films
61, 62 electrode layers
70 collecting electrode
71 first electroconductive layer
711 low-melting-point material
72 second electroconductive layer
9 insulating layer
9h opening section
50 photoelectric conversion section
400, 401, 402 insulating regions
100 solar cell
101 heterojunction solar cell
300 substrate holder (or bottom electrode)

The invention claimed is:

1. A method for producing a solar cell of a solar module, comprising:
    forming a first electrode layer on a first principal surface of a photoelectric conversion section, the first electrode layer being a transparent electrode layer, wherein the first principal surface is a light-incident surface of the solar cell;
    forming a second electrode layer on a second principal surface of the photoelectric conversion section; and
    forming a collecting electrode on the first electrode layer, the collecting electrode including a first electroconductive layer, an insulating layer and a second electroconductive layer in this order from a photoelectric conversion section side,
    formation of the collecting electrode includes:
        forming the first electroconductive layer on the first electrode layer;
        forming the insulating layer on the first electroconductive layer; and
        forming the second electroconductive layer conducting with the first electroconductive layer via an opening provided in the insulating layer by a plating method, in this order, wherein
    in formation of the first electrode layer, the first electrode layer is formed with a peripheral end of the first principal surface of the photoelectric conversion section covered with a mask so that the first electrode layer is not formed at the peripheral end of the first principal surface,
    in formation of the second electrode layer, the second electrode layer is formed without covering the photoelectric conversion section with any mask, including the mask, so that the second electrode layer is formed up to the peripheral end of the second principal surface,
    thereby an insulating region where neither of the first electrode layer and the second electrode layer are formed is provided at a peripheral edge of the first principal surface of the photoelectric conversion section,
    in formation of the insulating layer on the first electroconductive layer, the insulating layer is formed over an entirety of the first principal surface of the photoelectric conversion section up to the peripheral end of the first principal surface of the photoelectric conversion section,
    the insulating layer is formed directly on the second electrode layer on an entire side surface of the photoelectric conversion section to cover the entire side surface,
    the insulating layer is not directly formed on an entire surface of the second electrode layer disposed on the second principal surface,
    the formation of the insulating layer is performed by a dry process, and
    the insulating layer over the entirety of the first principal surface of the photoelectric conversion section up to the peripheral end of the first principal surface of the photoelectric conversion section, and the insulating layer directly on the second electrode layer on the entire side surface of the photoelectric conversion section covering the entire side surface are formed simultaneously via the dry process.

2. The method of claim 1, wherein the insulating layer is formed to cover at least a part of the insulating region.

3. The method of claim 1, wherein the insulating layer is formed to have a thickness of 30 nm to 1000 nm.

4. The method of claim 1, wherein the insulating layer is formed to cover the entire side surface and a peripheral edge of the second principal surface.

5. The method of claim 1, further comprising forming conductive silicon thin-films on first and second principal surfaces of a crystalline silicon substrate, wherein the photoelectric conversion section includes the crystalline silicon substrate and the conductive silicon thin-films, and the conductive silicon thin-films are deposited without using a mask.

6. The method of claim 5, wherein the conductive silicon thin-films include a first conductive silicon thin-film and a second conductive silicon thin-film, and an entirety of the first principal surface of the crystalline silicon substrate is covered with the first conductive silicon thin-film and an entirety of the second principal surface of the crystalline silicon substrate is covered with the second conductive silicon thin-film.

7. The method of claim 1, further comprising forming a first conductive silicon thin-film on a first principal surface of a crystalline silicon substrate, the insulating region provided on the first conductive silicon thin-film.

* * * * *